(12) United States Patent
Oue et al.

(10) Patent No.: US 12,207,382 B2
(45) Date of Patent: Jan. 21, 2025

(54) TARGET SUPPLY SYSTEM, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Nozomu Oue, Oyama (JP); Yutaka Shiraishi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 178 days.

(21) Appl. No.: 18/163,023

(22) Filed: Feb. 1, 2023

(65) Prior Publication Data

US 2023/0284364 A1   Sep. 7, 2023

(30) Foreign Application Priority Data

Mar. 1, 2022 (JP) .................. 2022-030642

(51) Int. Cl.
| | | |
|---|---|---|
| H05G 2/00 | (2006.01) | |
| G03F 7/00 | (2006.01) | |
| G03F 7/20 | (2006.01) | |
| G21K 1/06 | (2006.01) | |

(52) U.S. Cl.
CPC ......... H05G 2/006 (2013.01); G03F 7/70025 (2013.01); G03F 7/70033 (2013.01); H05G 2/008 (2013.01); G21K 1/06 (2013.01)

(58) Field of Classification Search
CPC ........ H05G 2/006; H05G 2/008; H05G 2/005; G03F 7/70025; G03F 7/70033; G21K 1/06
See application file for complete search history.

(56) References Cited

U.S. PATENT DOCUMENTS

| | | | |
|---|---|---|---|
| 9,699,876 | B2 | 7/2017 | Vaschenko et al. |
| 10,548,209 | B2 | 1/2020 | Ishihara |
| 2006/0133967 | A1 | 6/2006 | Selt et al. |
| 2013/0206863 | A1 | 8/2013 | Yabu et al. |
| 2022/0159817 | A1* | 5/2022 | Govindaraju ....... G03F 7/70033 |

FOREIGN PATENT DOCUMENTS

| | | | |
|---|---|---|---|
| JP | 2009-015545 A | 1/2009 | |
| JP | 2010-123405 A | 6/2010 | |

OTHER PUBLICATIONS

Search Report issued by the Netherlands Patent Center on Jan. 10, 2024, which corresponds to Dutch Patent Application No. 2034126 and is related to U.S. Appl. No. 18/163,023; including partial English language translation.

* cited by examiner

*Primary Examiner* — Mesfin T Asfaw
(74) *Attorney, Agent, or Firm* — Studebaker & Brackett PC

(57) ABSTRACT

A target supply system includes a target generation unit configured to generate a liquid target substance by melting a solid target substance at an inside thereof, and output the liquid target substance; an input mechanism configured to introduce the solid target substance to the target generation unit; a heater arranged at the target generation unit; a sensor configured to detect a temperature of the target generation unit; and a processor configured to control an input timing at which the solid target substance is introduced to the target generation unit, perform feedback control on the heater based on a present temperature detected by the sensor, and perform feedforward control on the heater based on the input timing while performing feedback control on the heater.

20 Claims, 25 Drawing Sheets

TARGET SUPPLY SYSTEM, EXTREME ULTRAVIOLET LIGHT GENERATION APPARATUS, AND ELECTRONIC DEVICE MANUFACTURING METHOD

The present application claims the benefit of Japanese Patent Application No. 2022-030642, filed on Mar. 1, 2022, the entire contents of which are hereby incorporated by reference.

BACKGROUND

1. Technical Field

The present disclosure relates to a target supply system, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, the development of an exposure apparatus that combines an extreme ultraviolet (EUV) light generation apparatus that generates EUV light having a wavelength of about 13 nm and reduced projection reflection optics is expected.

As the EUV light generation apparatus, a laser produced plasma (LPP) type apparatus using plasma generated by irradiating a target substance with pulse laser light has been developed.

PATENT DOCUMENTS

List of Documents

Patent Document 1: Japanese Patent Application Publication No. 2010-123405
Patent Document 2: US Patent Application Publication No. 2013/0206863
Patent Document 3: Japanese Patent Application Publication No. 2009-015545
Patent Document 4: US Patent Application Publication No. 2006/0133967

SUMMARY

A target supply system according to an aspect of the present disclosure includes a target generation unit configured to generate a liquid target substance by melting a solid target substance at an inside thereof, and output the liquid target substance; an input mechanism configured to introduce the solid target substance to the target generation unit; a heater arranged at the target generation unit; a sensor configured to detect a temperature of the target generation unit; and a processor configured to control an input timing at which the solid target substance is introduced to the target generation unit, perform feedback control on the heater based on a present temperature detected by the sensor, and perform feedforward control on the heater based on the input timing while performing feedback control on the heater.

An electronic device manufacturing method according to an aspect of the present disclosure includes generating extreme ultraviolet light using an extreme ultraviolet light generation apparatus, outputting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a target supply system; a laser device configured to irradiate, with pulse laser light, a liquid target substance reaching a predetermined region after being output from the target supply system; and an EUV light concentrating mirror configured to concentrate the extreme ultraviolet light emitted from plasma generated in the predetermined region. The target supply system includes a target generation unit configured to generate the liquid target substance by melting a solid target substance at the inside thereof, and output the liquid target substance; an input mechanism configured to introduce the solid target substance to the target generation unit; a heater arranged at the target generation unit; a sensor configured to detect a temperature of the target generation unit; and a processor configured to control an input timing at which the solid target substance is introduced to the target generation unit, perform feedback control on the heater based on a present temperature detected by the sensor, and perform feedforward control on the heater based on the input timing while performing feedback control on the heater.

An electronic device manufacturing method according to an aspect of the present disclosure includes inspecting a defect of a mask by irradiating the mask with extreme ultraviolet light generated by an extreme ultraviolet light generation apparatus, selecting a mask using a result of the inspection, and exposing and transferring a pattern formed on the selected mask onto a photosensitive substrate. Here, the extreme ultraviolet light generation apparatus includes a target supply system; a laser device configured to irradiate, with pulse laser light, a liquid target substance reaching a predetermined region after being output from the target supply system; and an EUV light concentrating mirror configured to concentrate the extreme ultraviolet light emitted from plasma generated in the predetermined region. The target supply system includes a target generation unit configured to generate the liquid target substance by melting a solid target substance at the inside thereof, and output the liquid target substance; an input mechanism configured to introduce the solid target substance to the target generation unit; a heater arranged at the target generation unit; a sensor configured to detect a temperature of the target generation unit; and a processor configured to control an input timing at which the solid target substance is introduced to the target generation unit, perform feedback control on the heater based on a present temperature detected by the sensor, and perform feedforward control on the heater based on the input timing while performing feedback control on the heater.

BRIEF DESCRIPTION OF THE DRAWINGS

Embodiments of the present disclosure will be described below merely as examples with reference to the accompanying drawings.

DESCRIPTION OF EMBODIMENTS

Contents

Figure 1:
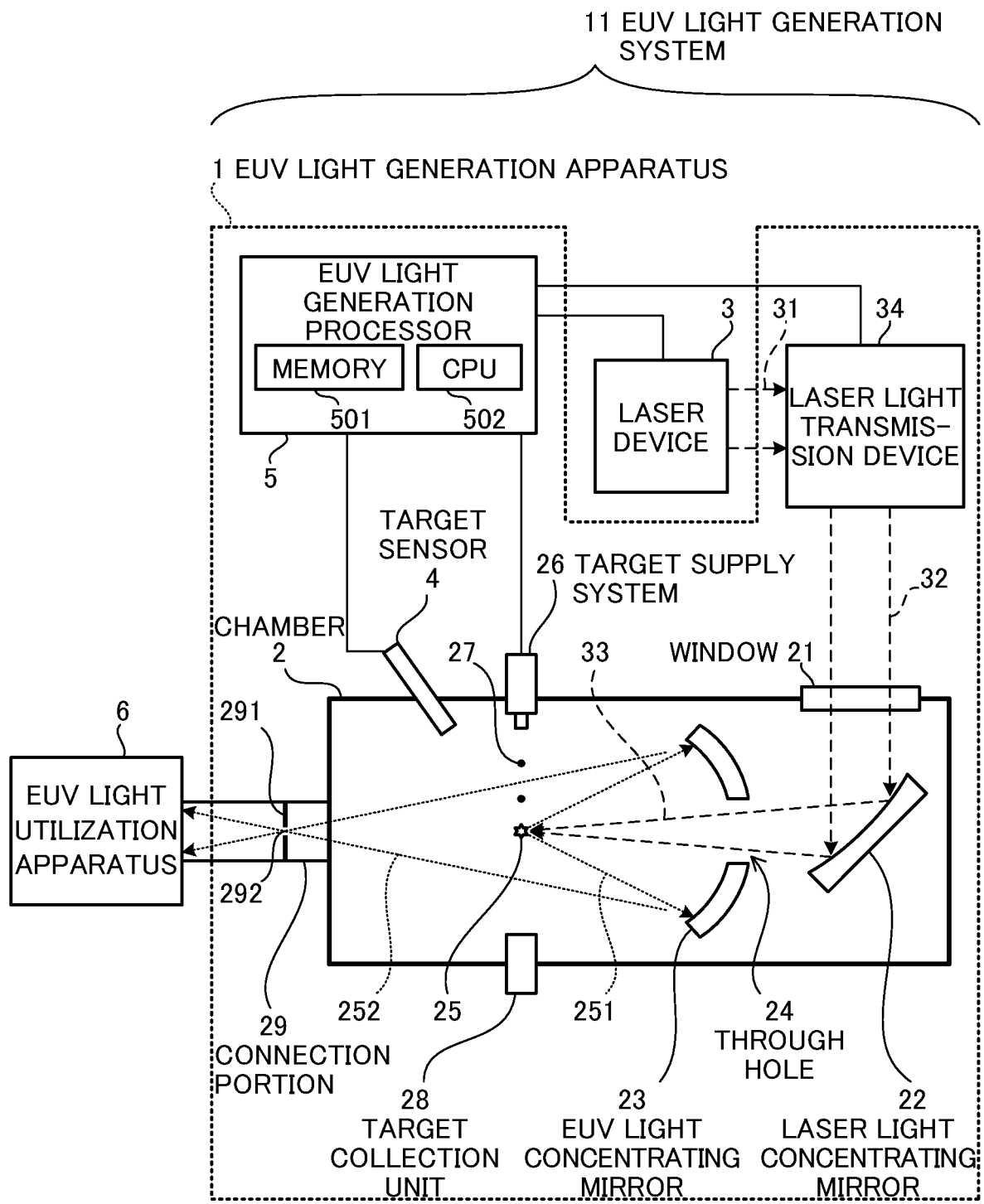
FIG. 1 schematically shows the configuration of an LPP EUV light generation system.

1. Overall description of EUV light generation system 11
    1.1 Configuration
    1.2 Operation
2. Comparative example
    2.1 Configuration
        2.1.1 Reservoir tank C1
        2.1.2 Load lock chamber C2
        2.1.3 Target generation unit 260
        2.1.4 Detail of load lock chamber C2 and solid target supply valve VT2
    2.2 Operation
        2.2.1 Operation of EUV light generation processor 5
        2.2.2 Input control of solid target substance 27*a*
        2.2.3 Temperature control of large tank 71*t*
        2.2.4 Temperature control of small tank 7*st*
        2.2.5 Temperature control of nozzle 7*nz*
        2.2.6 Block diagram
    2.3 Problem of comparative example
3. Suppression of temperature decrease by feedforward control
    3.1 Operation
        3.1.1 Input control of solid target substance 27*a*
        3.1.2 Temperature control of large tank 71*t*
        3.1.3 Temperature control of small tank 7*st*
        3.1.4 Temperature control of nozzle 7*nz*
        3.1.5 Block diagram
    3.2 Simulation result
    3.3 Effect
4. Example in which feedforward control is selectable
    4.1 Operation
        4.1.1 Input control of solid target substance 27*a*
        4.1.2 Temperature control of large tank 71*t*
        4.1.3 Temperature control of small tank 7*st*
        4.1.4 Temperature control of nozzle 7*nz*
        4.1.5 Block diagram
    4.2 Effect
5. Example of performing feedforward control on temperatures of small tank 7*st* and nozzle 7*nz*
    5.1 Operation
        5.1.1 Input control of solid target substance 27*a*
        5.1.2 Temperature control of large tank 71*t*
        5.1.3 Temperature control of small tank 7*st*
        5.1.4 Temperature control of nozzle 7*nz*
        5.1.5 Block diagram
    5.2 Simulation result
    5.3 Effect
6. Example of performing feedforward control using correction value fcst(t) of current
    6.1 Operation
        6.1.1 Input control of solid target substance 27*a*
        6.1.2 Temperature control of large tank 71*t*
        6.1.3 Temperature control of small tank 7*st*
        6.1.4 Temperature control of nozzle 7*nz*
        6.1.5 Block diagram
    6.2 Simulation result
    6.3 Effect
7. Example in which waveform of correction value fcst (t) of current is rectangular wave
8. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure.

Here, the same components are denoted by the same reference numerals, and duplicate description thereof is omitted.

1. Overall Description of EUV Light Generation System 11

1.1 Configuration

FIG. 1 schematically shows the configuration of an LPP EUV light generation system 11. An EUV light generation apparatus 1 is used together with a laser device 3. In the present disclosure, a system including the EUV light generation apparatus 1 and the laser device 3 is referred to as the EUV light generation system 11. The EUV light generation apparatus 1 includes a chamber 2 and a target supply system 26. The chamber 2 is a sealable container. The target supply system 26 supplies a target 27 containing a target substance into the chamber 2. The material of the target substance may include tin, terbium, gadolinium, lithium, xenon, or a combination of any two or more thereof.

A through hole is formed in a wall of the chamber 2. The through hole is blocked by a window 21 and pulse laser light 32 output from the laser device 3 passes through the window 21. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes an EUV light generation processor 5, a target sensor 4, and the like. The EUV light generation processor 5 is a processing device including a memory 501 in which a control program is stored and a central processing unit (CPU) 502 which executes the control program. The EUV light generation processor 5 is specifically configured or programmed to perform various processes included in the present disclosure. The target sensor 4 detects at least one of the presence, trajectory, position, and velocity of the target 27. The target sensor 4 may have an imaging function.

Further, the EUV light generation apparatus 1 includes a connection portion 29 providing communication between the internal space of the chamber 2 and the internal space of an EUV light utilization apparatus 6. An example of the EUV light utilization apparatus 6 will be described later with reference to FIGS. 27 and 28. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of the pulse laser light 32, and an actuator for adjusting the position, posture, and the like of the optical element.

1.2 Operation

Operation of the EUV light generation system 11 will be described with reference to FIG. 1. Pulse laser light 31 output from the laser device 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply system 26 outputs the target 27 toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light included in the radiation light 251 is reflected by the EUV light concentrating mirror 23 with higher reflectance than light in other wavelength ranges. Reflection light 252 including the EUV light reflected by the EUV light concentrating mirror 23 is concentrated at the intermediate focal point 292 and output to the EUV light utilization apparatus 6. Here, one target 27 may be irradiated with a plurality of pulses included in the pulse laser light 33.

The EUV light generation processor 5 controls the entire EUV light generation system 11. The EUV light generation processor 5 processes a detection result of the target sensor 4. Based on the detection result of the target sensor 4, the EUV light generation processor 5 controls the timing at which the target 27 is output, the output direction of the target 27, and the like. Further, the EUV light generation processor 5 controls an oscillation timing of the laser device 3, the travel direction of the pulse laser light 32, the concentration position of the pulse laser light 33, and the like. Such various kinds of control described above are merely exemplary, and other control may be added as necessary.

2. Comparative Example

2.1 Configuration

Figure 2:
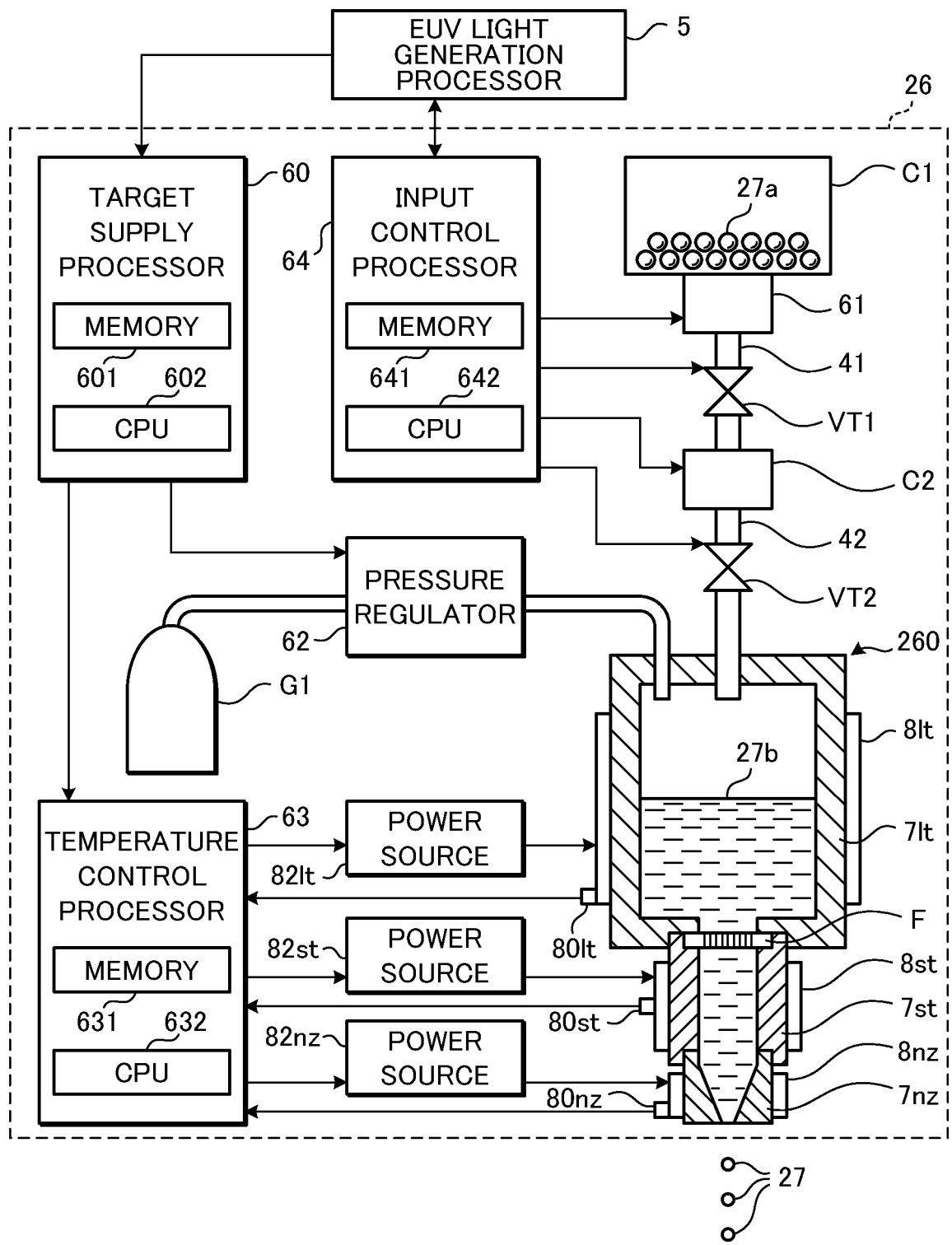
FIG. 2 schematically shows the configuration of a target supply system according to a comparative example.

FIG. 2 schematically shows the configuration of the target supply system 26 according to a comparative example. The comparative example of the present disclosure is an example recognized by the applicant as known only by the applicant, and is not a publicly known example admitted by the applicant. As shown in FIG. 2, the target supply system 26 according to the comparative example includes a reservoir tank C1, a load lock chamber C2, a target generation unit 260, a target supply processor 60, a measuring instrument 61, a pressure regulator 62, a temperature control processor 63, and an input control processor 64.

The target supply processor 60 is a processing device including a memory 601 in which a control program is stored and a CPU 602 which executes the control program. The target supply processor 60 is specifically configured or programmed to perform various processes included in the present disclosure. The target supply processor 60 transmits a control signal to the pressure regulator 62 and the temperature control processor 63.

2.1.1 Reservoir Tank C1

The reservoir tank C1 is a container containing the solid target substance 27a such as tin. The solid target substance 27a may be, for example, spherical particles of substantially the same size. Alternatively, the particles may have a shape other than a spherical shape. The temperature in the reservoir tank C1 is lower than the melting point of the target substance. The gas pressure in the reservoir tank C1 is substantially equal to the atmospheric pressure.

The measuring instrument 61 is arranged at the lower end of the reservoir tank C1 in the gravity direction. The reservoir tank C1 is connected to the solid target supply pipe 41 via the measuring instrument 61, and the solid target supply pipe 41 is connected to the load lock chamber C2. A solid target supply valve VT1 is arranged at the solid target supply pipe 41.

The measuring instrument 61 normally stops the supply of the solid target substance 27a to the solid target supply pipe 41. The measuring instrument 61 can pass the solid target substance 27a supplied from the reservoir tank C1 to the load lock chamber C2 while measuring the amount of the solid target substance 27a. Measuring the amount of the solid target substance 27a includes counting the number of particles of the solid target substance 27a. The measured solid target substance 27a is moved by gravity to the load lock chamber C2 as passing through the solid target supply pipe 41 and the solid target supply valve VT1. After a predetermined amount of the solid target substance 27a passes, the measuring instrument 61 stops passing of the solid target substance 27a.

2.1.2 Load Lock Chamber C2

The load lock chamber C2 is a container configured capable of containing the solid target substance 27a supplied from the reservoir tank C1. The temperature in the load lock chamber C2 is lower than the melting point of the target substance.

The load lock chamber C2 is connected to the solid target supply pipe 42, and the solid target supply pipe 42 is connected to the target generation unit 260. A solid target supply valve VT2 is arranged at the solid target supply pipe 42. The configurations of the load lock chamber C2 and the solid target supply valve VT2 will be described later with reference to FIGS. 3 and 4.

The solid target supply valves VT1, VT2 are normally closed, and only when one of them is closed, the other is to be opened. That is, when the solid target substance 27a is moved from the reservoir tank C1 to the load lock chamber C2a via the measuring instrument 61, the solid target supply valve VT2 is temporarily opened while the solid target supply valve VT1 is closed. Further, when the solid target substance 27a is introduced from the load lock chamber C2 to the target generation unit 260, the solid target supply valve VT2 is temporarily opened while the solid target supply valve VT1 is closed. Thus, the gas in the target generation unit 260 is suppressed from flowing toward the reservoir tank C1.

The input control processor 64 is a processing device including a memory 641 in which a control program is stored and a CPU 622 which executes the control program. The input control processor 64 configures the processor in the present disclosure. The input control processor 64 is specifically configured or programmed to perform various processes included in the present disclosure. The input control processor 64 controls the measuring instrument 61, the solid target supply valves VT1, VT2, and an adjustment mechanism 66, which will be described later, provided in the load lock chamber C2. The measuring instrument 61, the solid target supply valves VT1, VT2, and the adjustment mechanism 66 configure the input mechanism in the present disclosure.

2.1.3 Target Generation Unit 260

The target generation unit 260 is a device that generates a liquid target substance 27b by melting, at the inside thereof, the solid target substance 27a introduced from the load lock chamber C2 through the solid target supply pipe 42, and outputs the liquid target substance 27b as the target 27.

The target generation unit 260 includes a large tank 71t, a small tank 7st, and a nozzle 7nz. The large tank 71t melts the solid target substance 27a therein to generate the liquid target substance 27b. The small tank 7st passes the liquid target substance 27b generated in the large tank 71t toward the nozzle 7nz. The nozzle 7nz outputs the liquid target substance 27b generated in the large tank 71t. A filter F is arranged between the large tank 71t and the small tank 7st. The filter F is a plate having a large number of fine through holes, and suppresses solid matters mixed to the inside of the large tank 71t from flowing into the small tank 7st. The large tank 71t corresponds to the first tank in the present disclosure, and the small tank 7st corresponds to the second tank in the present disclosure. Here, the large tank 71t may not be larger than the small tank 7st.

In the present disclosure, a region including the large tank 71t in the target generation unit 260 may be referred to as the first region, and a region including the nozzle 7nz in the target generation unit 260 may be referred to as the second region.

The boundary between the first region and the second region may be defined by the position of the filter F. In this case, the small tank 7st is included in the second region, but the present disclosure is not limited thereto.

Heaters 81t, 8st, 8nz are arranged at the large tank 71t, the small tank 7st, and the nozzle 7nz, respectively. The heaters 81t, 8st, 8nz are connected to power sources 821t, 82st, 82nz, respectively, and heat the inside of the target generation unit 260 to a predetermined temperature higher than the melting point of the target substance. The temperature of the inside of the target generation unit 260 is controlled by controlling the power sources 821t, 82st, 82nz based on the outputs of sensors 801t, 80st, 80nz arranged at the heaters 81t, 8st, 8nz, respectively. The sensor 80lt is arranged at the heater 81t and is not in contact with the large tank 71t and the liquid target substance 27b therein. However, since the thermal conductivity of each of the large tank 71t and the liquid target substance 27b is high enough so that the temperature of the large tank 71t and the temperature of the liquid target substance 27b therein can be regarded as being substantially the same as the temperature of the heater 81t, these temperatures may be measured by the sensor 80lt. The sensors 80st, 80nz are arranged at the heaters 8st, 8st, respectively, and are not in contact with the small tank 7st, the nozzle 7nz, and the liquid target substance 27b therein. However, the above is the same for the thermal conductivity of the small tank 7st and the nozzle 7nz, and the temperatures may be measured by the sensors 80st, 80nz, respectively. The sensors 801t, 80st, 80nz may also be attached directly to the large tank 71t, the small tank 7st, and the nozzle 7nz, respectively.

In the present disclosure, one heater arranged in the first region among the heaters 81t, 8st, 8nz is referred to as the first heater, and one heater arranged in the second region among the heaters 81t, 8st, 8nz is referred to as the second heater. For example, the heater 81t corresponds to the first heater, and one of the heater 8st and the heater 8nz corresponds to the second heater. Alternatively, one of the heater 81t and the heater 8st corresponds to the first heater, and the heater 8nz corresponds to the second heater. Alternatively, the heater 81t corresponds to the first heater, the heater 8st corresponds to the second heater, and the heater 8nz corresponds to the third heater.

The large tank 71*t* is connected to the pressure regulator 62 via a gas pipe. The pressure regulator 62 is connected to a gas cylinder G1. The gas cylinder G1 contains a high-pressure rare gas such as an argon gas or a helium gas as a pressurized gas. The pressure regulator 62 regulates the pressure of the gas supplied from the gas cylinder G1 and supplies the gas to the large tank 71*t*. The gas pressure in the large tank 71*t* is lower than the gas pressure supplied from the gas cylinder G1 and higher than the atmospheric pressure.

The small tank 7*st* is located between the large tank 71*t* and the nozzle 7*nz*. The nozzle 7*nz* is arranged at a lower end portion of the target generation unit 260 in the gravity direction. The tip of the nozzle 7*nz* is opened to the inside of the chamber 2 (see FIG. 1). The liquid target substance 27*b* in the target generation unit 260 is output from the opening at the tip of the nozzle 7*nz* owing to the difference between the gas pressure supplied from the pressure regulator 62 and the gas pressure in the chamber 2. When vibration is applied to the nozzle 7*nz* by a piezoelectric element (not shown), the jet-like liquid target substance 27*b* output from the nozzle 7*nz* is separated into droplets to form the target 27.

The temperature control processor 63 is a processing device including a memory 631 in which a control program is stored and a CPU 632 which executes the control program. The temperature control processor 63 configures the processor in the present disclosure. The temperature control processor 63 is specifically configured or programmed to perform various processes included in the present disclosure. The temperature control processor 63 determines current values of the heaters 81*t*, 8*st*, 8*nz* based on the temperature of the target generation unit 260 detected by the sensors 801*t*, 80*st*, 80*nz*, and controls the power sources 821*t*, 82*st*, 82*nz*.

2.1.4 Detail of Load Lock Chamber C2 and Solid Target Supply Valve VT2

Figure 3:
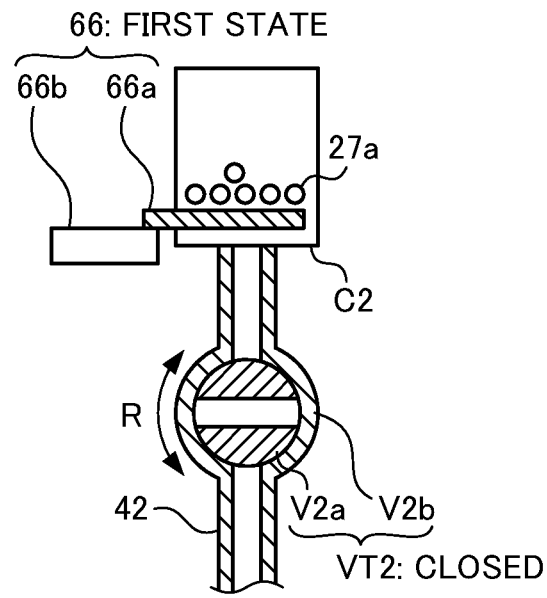
FIG. 3 shows the configuration of a load lock chamber and a solid target supply valve, and their operation is shown in combination with FIG. 4.
Figure 4:
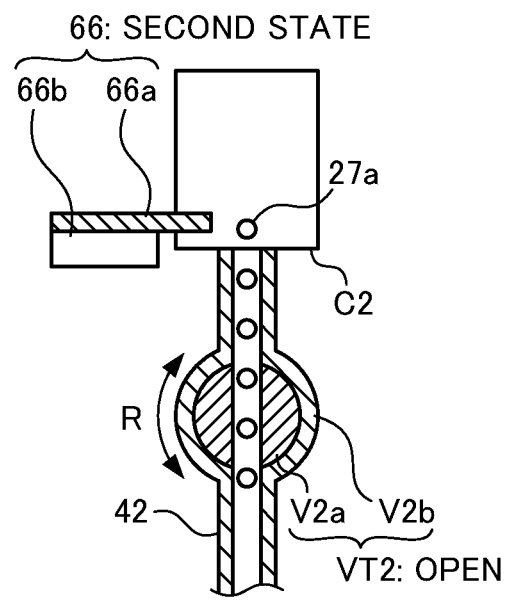
FIG. 4 shows the configuration of the load lock chamber and the solid target supply valve, and their operation is shown in combination with FIG. 3.

Each of FIGS. 3 and 4 shows the configuration of the load lock chamber C2 and the solid target supply valve VT2, and their operation is shown in combination of FIGS. 3 and 4.

The adjustment mechanism 66 included in the load lock chamber C2 includes a receiving plate 66*a* and an actuator 66*b*. The receiving plate 66*a* is located near the lower end of the load lock chamber C2 in the gravity direction. The actuator 66*b* is configured to switch the adjustment mechanism 66 between a first state shown in FIG. 3 and a second state shown in FIG. 4 by moving the receiving plate 66*a*.

In the first state, the receiving plate 66*a* is arranged to block a connection portion between the load lock chamber C2 and the solid target supply pipe 42. Thus, the movement of the solid target substance 27*a* toward the solid target supply valve VT2 is suppressed.

In the second state, the receiving plate 66*a* is arranged at a position away from the connecting portion between the load lock chamber C2 and the solid target supply pipe 42. Thus, the movement of the solid target substance 27*a* toward the solid target supply valve VT2 is allowed.

The adjustment mechanism 66 is normally set in the first state, and is temporarily set in the second state when the solid target substance 27*a* is to be moved toward the solid target supply valve VT2.

The solid target supply valve VT2 includes, for example, a ball valve including a ball portion V2*a* and a body portion V2*b*. By rotating the ball portion V2*a* inside the body portion V2*b* in the direction of an arrow R, switching is performed between the closed state shown in FIG. 3 and the open state shown in FIG. 4. In the closed state, the flow of gas from the target generation unit 260 to the load lock chamber C2 is suppressed, and in the open state, the solid target substance 27*a* is allowed to be introduced from the load lock chamber C2 to the target generation unit 260.

2.2 Operation

2.2.1 Operation of EUV Light Generation Processor 5

Figure 5:
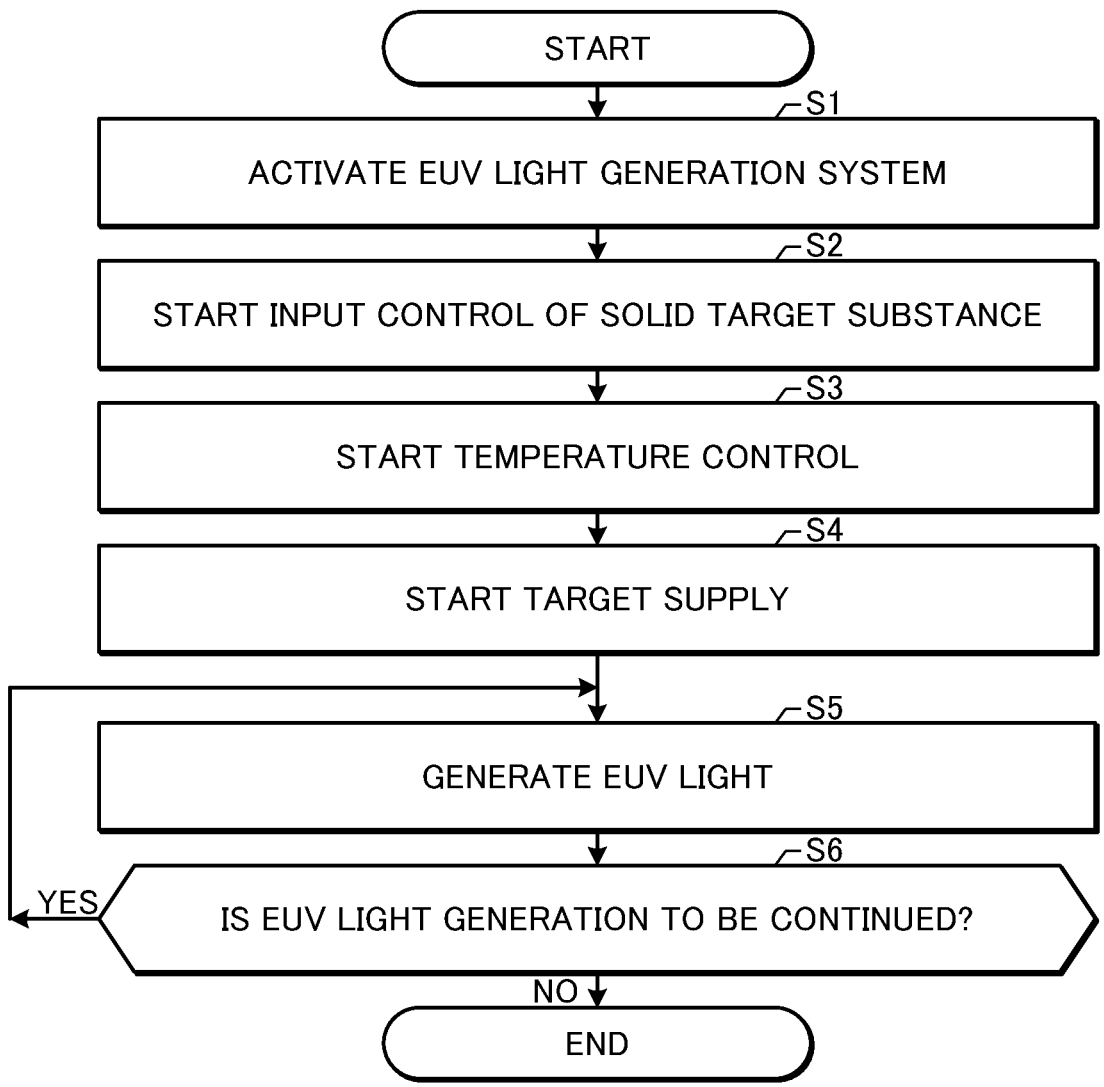
FIG. 5 is a flowchart for an EUV light generation processor in the comparative example.

FIG. 5 is a flowchart for the EUV light generation processor 5 in the comparative example. The EUV light generation processor 5 operates the EUV light generation system 11 in the following manner to generate EUV light.

In S1, the EUV light generation processor 5 activates the EUV light generation system 11. The activation of the EUV light generation system 11 includes activation of various power sources included in the EUV light generation system 11, activation of various processors, gas purging and vacuuming of various devices, and the like.

In S2, the EUV light generation processor 5 causes the input control processor 64 to start input control of the solid target substance 27*a*. After being started in S2, the input control of the solid target substance 27*a* is repeated until, for example, the EUV light generation is completed. The input control of the solid target substance 27*a* will be described later with reference to FIG. 6.

In S3, the EUV light generation processor 5 transmits a control signal to the target supply processor 60 to cause the temperature control processor 63 to start temperature control of the large tank 71*t*, the small tank 7*st*, and the nozzle 7*nz*. After being started in S3, the temperature control is repeated until, for example, the EUV light generation is completed. The temperature control will be described later with reference to FIGS. 7 to 9.

In S4, the EUV light generation processor 5 causes the target supply processor 60 to start the target supply. The target supply is started, for example, by the pressure regulator 62 adjusting the gas pressure in the large tank 71*t* to a high pressure.

In S5, the EUV light generation processor 5 performs processing for EUV light generation. The EUV light generation is performed by controlling the laser device 3, the laser light transmission device 34, and the like so that the target 27 is irradiated with the pulse laser light 33 at a timing when the target 27 reaches the plasma generation region 25 (see FIG. 1).

In S6, the EUV light generation processor 5 determines whether or not to continue the EUV light generation. When the EUV light generation is to be continued (S6: YES), the EUV light generation processor 5 returns processing to S5. When the EUV light generation is not to be continued (S6: NO), the EUV light generation processor 5 ends processing of the present flowchart.

2.2.2 Input Control of Solid Target Substance 27*a*

Figure 6:
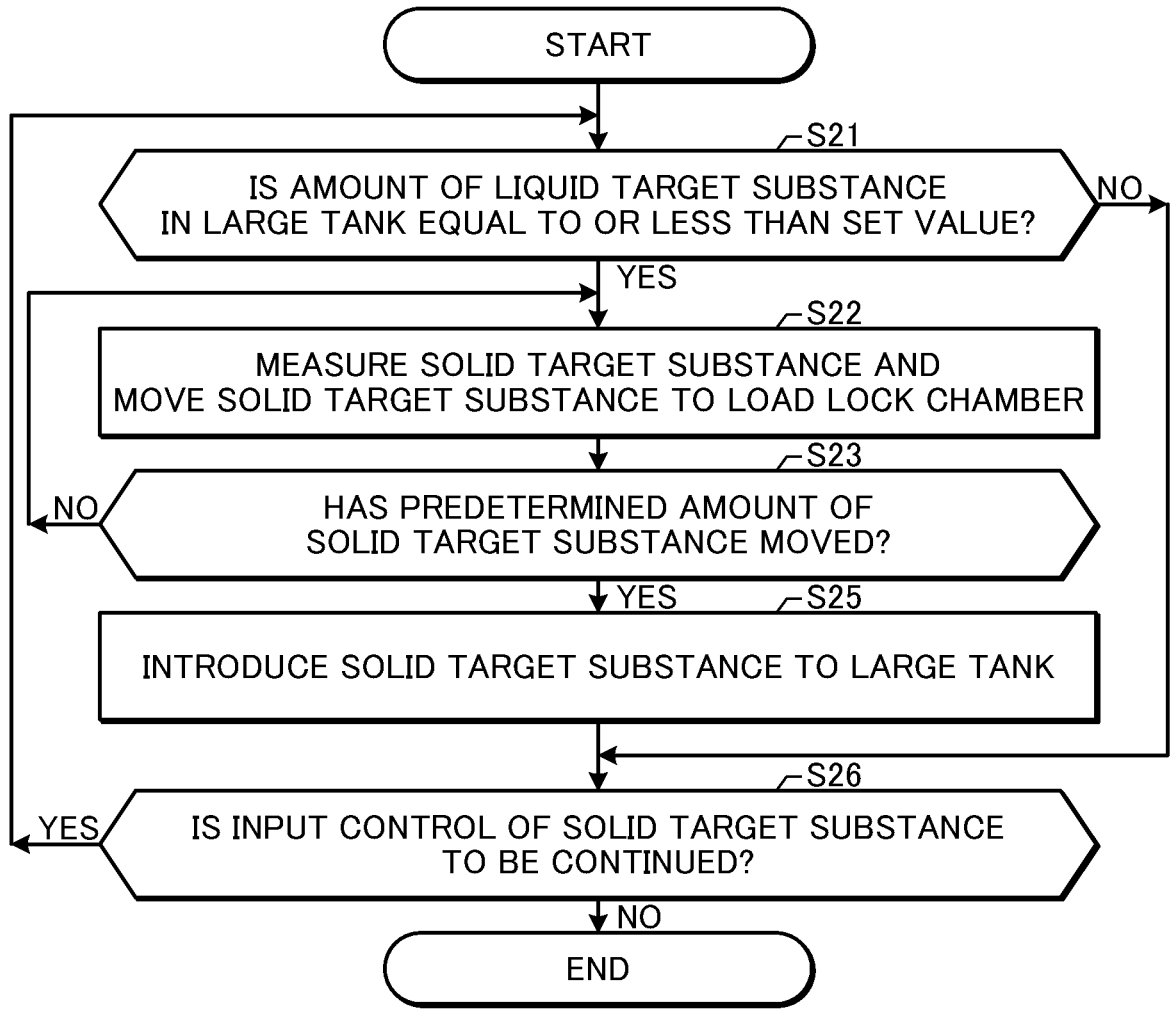
FIG. 6 is a flowchart for an input control processor in the comparative example.

FIG. 6 is a flowchart for the input control processor 64 in the comparative example. The solid target substance 27*a* is introduced to the target generation unit 260 in the following manner.

In S21, the input control processor 64 determines whether or not the amount of the liquid target substance 27*b* in the large tank 71*t* is equal to or less than a set value. The amount of the liquid target substance 27*b* is determined by the output of a liquid level sensor (not shown) arranged in the large tank 71t. When the amount of the liquid target substance 27b is equal to or less than the set value (S21: YES), the input control processor 64 advances processing to S22. When the amount of the liquid target substance 27b is larger than the set value (S21: NO), the input control processor 64 advances processing to S26. The input timing is controlled by waiting without introducing the solid target substance 27a until the amount of the liquid target substance 27b becomes equal to or less than the set value.

In S22, the input control processor 64 controls the measuring instrument 61 and the solid target supply valve VT1 so as to measure the solid target substance 27a one by one and move the solid target substance 27a to the load lock chamber C2.

In S23, the input control processor 64 determines whether or not a predetermined amount of the solid target substance 27a has moved to the load lock chamber C2. When the predetermined amount of the solid target substance 27a has not moved (S23: NO), the input control processor 64 returns processing to S22. When the predetermined amount of the solid target substance 27a has moved (S23: YES), the input control processor 64 advances processing to S25. By continuing the measurement until the predetermined amount of the solid target substance 27a moves, the input amount of the solid target substance 27a is controlled.

In S25, the input control processor 64 controls the adjustment mechanism 66 in the load lock chamber C2 and the solid target supply valve VT2 so as to introduce the solid target substance 27a to the load lock chamber C2.

In S26, the input control processor 64 determines whether or not the input control of the solid target substance 27a is to be continued. For example, when the EUV light generation processor 5 determines that the EUV light generation is to be continued, it is also determined that the input control of the solid target substance 27a is to be continued. When the input control of the solid target substance 27a is to be continued (S26: YES), the input control processor 64 returns processing to S21. When the input control of the solid target substance 27a is not to be continued (S26: NO), the input control processor 64 ends processing of the present flowchart.

By such operation, the solid target substance 27a contained in the reservoir tank C1, which is substantially at the atmospheric pressure, is introduced to the target generation unit 260 having a high pressure. Even when the liquid target substance 27b in the target generation unit 260 is consumed, the target substance can be replenished without replacing the target generation unit 260, so that the downtime of the EUV light generation apparatus 1 can be reduced.

2.2.3 Temperature Control of Large Tank 71t

Figure 7:
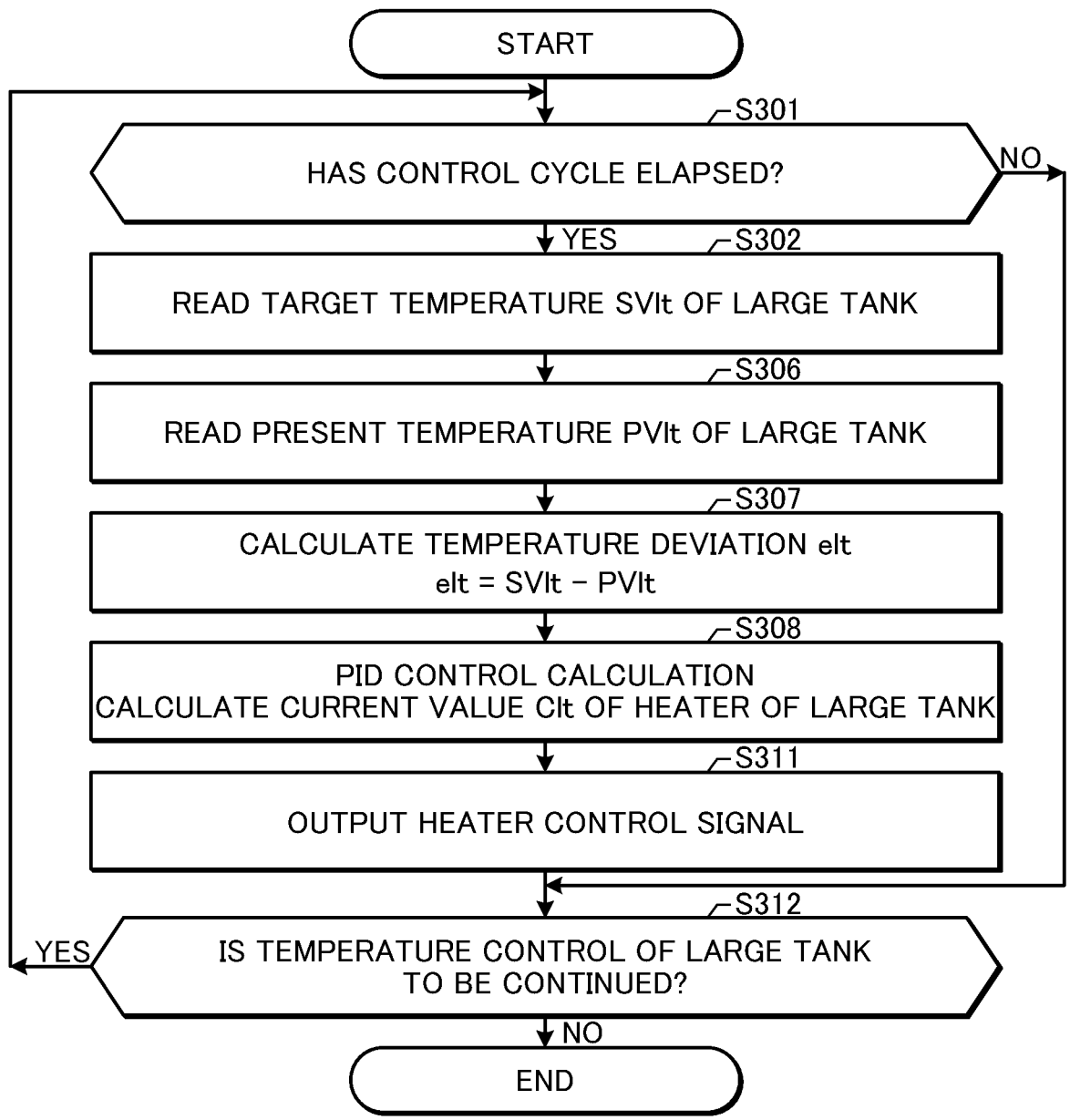
FIG. 7 is a flowchart of temperature control of a large tank by a temperature control processor in the comparative example.

FIG. 7 is a flowchart of the temperature control of the large tank 71t by the temperature control processor 63 in the comparative example. The temperature of the large tank 71t is feedback controlled as follows.

In S301, the temperature control processor 63 determines whether or not a control cycle of the temperature of the large tank 71t has elapsed. When the control cycle has elapsed (S301: YES), the temperature control processor 63 advances processing to S302. When the control cycle has not elapsed (S301: NO), the temperature control processor 63 advances processing to S312.

In S302, the temperature control processor 63 reads a target temperature SVlt of the large tank 71t from the memory 631.

In S306, the temperature control processor 63 reads a present temperature PVlt of the large tank 71t detected by the sensor 80lt.

In S307, the temperature control processor 63 calculates a temperature deviation elt between the target temperature SVlt and the present temperature PVlt by the following equation.

$$elt = SVlt - PVlt$$

In S308, the temperature control processor 63 performs PID control calculation to calculate a current value Clt of the heater 81t.

In S311, the temperature control processor 63 outputs a heater control signal for the heater 81t using the current value Clt.

In S312, the temperature control processor 63 determines whether or not to continue the temperature control of the large tank 71t. For example, when the EUV light generation processor 5 determines that the EUV light generation is to be continued, it is also determined that the temperature control is to be continued. When the temperature control is to be continued (S312: YES), the temperature control processor 63 returns processing to S301. When the temperature control is not to be continued (S312: NO), the temperature control processor 63 ends processing of the present flowchart.

2.2.4 Temperature Control of Small Tank 7st

Figure 8:
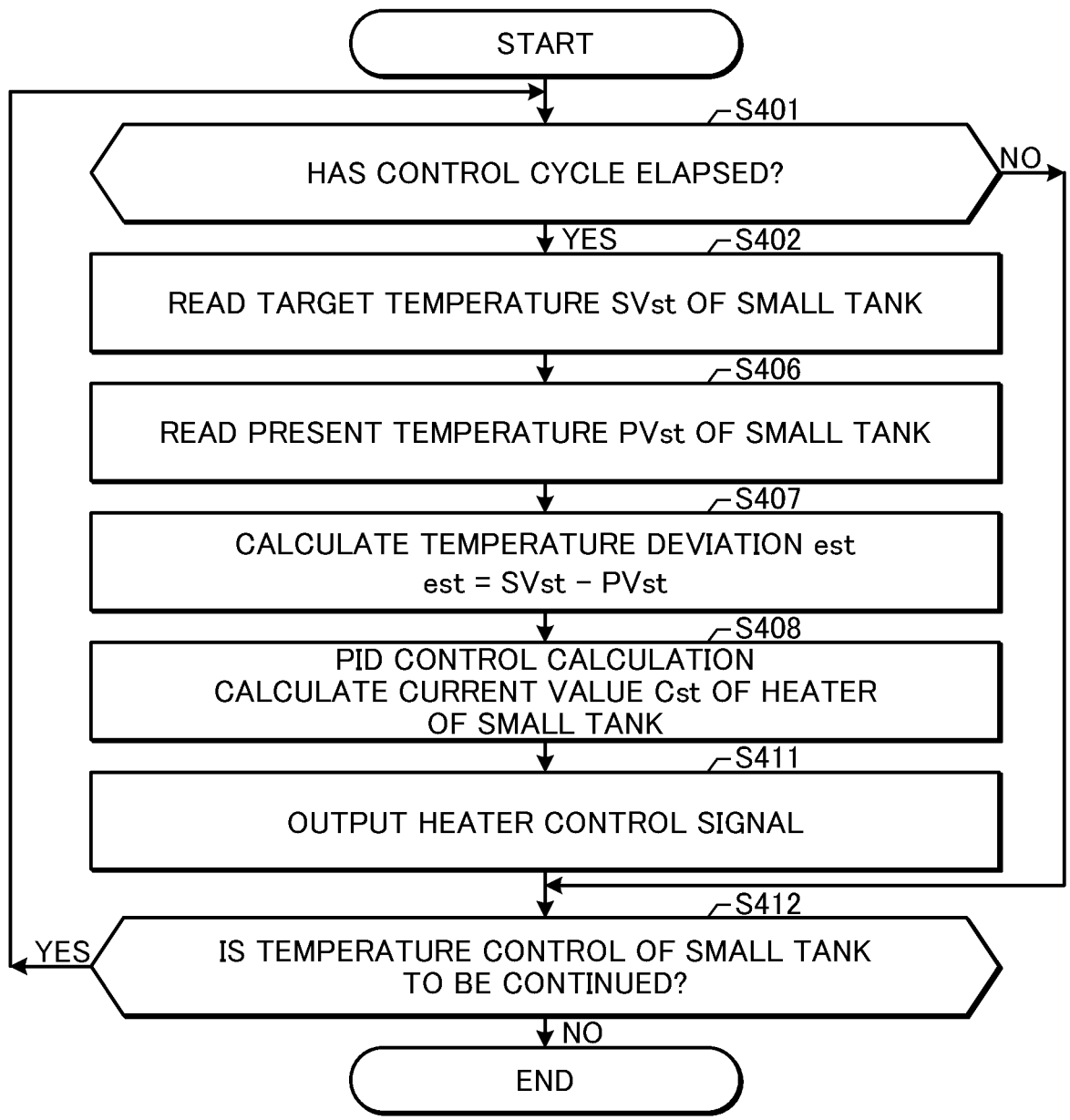
FIG. 8 is a flowchart of the temperature control of a small tank by the temperature control processor in the comparative example.

FIG. 8 is a flowchart of the temperature control of the small tank 7st by the temperature control processor 63 in the comparative example. The temperature control of the small tank 7st corresponds to the temperature control of the large tank 71t described with reference to FIG. 7 with the following points replaced.

Step numbers starting from "S3" are replaced with step numbers starting from "S4."

The target temperature SVlt of the large tank 71t is replaced with the target temperature SVst of the small tank 7st. Specific numerical values of the target temperatures SVlt, SVst may be the same as each other.

The present temperature PVlt of the large tank 71t is replaced with the present temperature PVst of the small tank 7st.

The temperature deviation elt is replaced with the temperature deviation est.

The current value Clt of the heater 81t is replaced with the current value Cst of the heater 8st.

2.2.5 Temperature Control of Nozzle 7Nz

Figure 9:
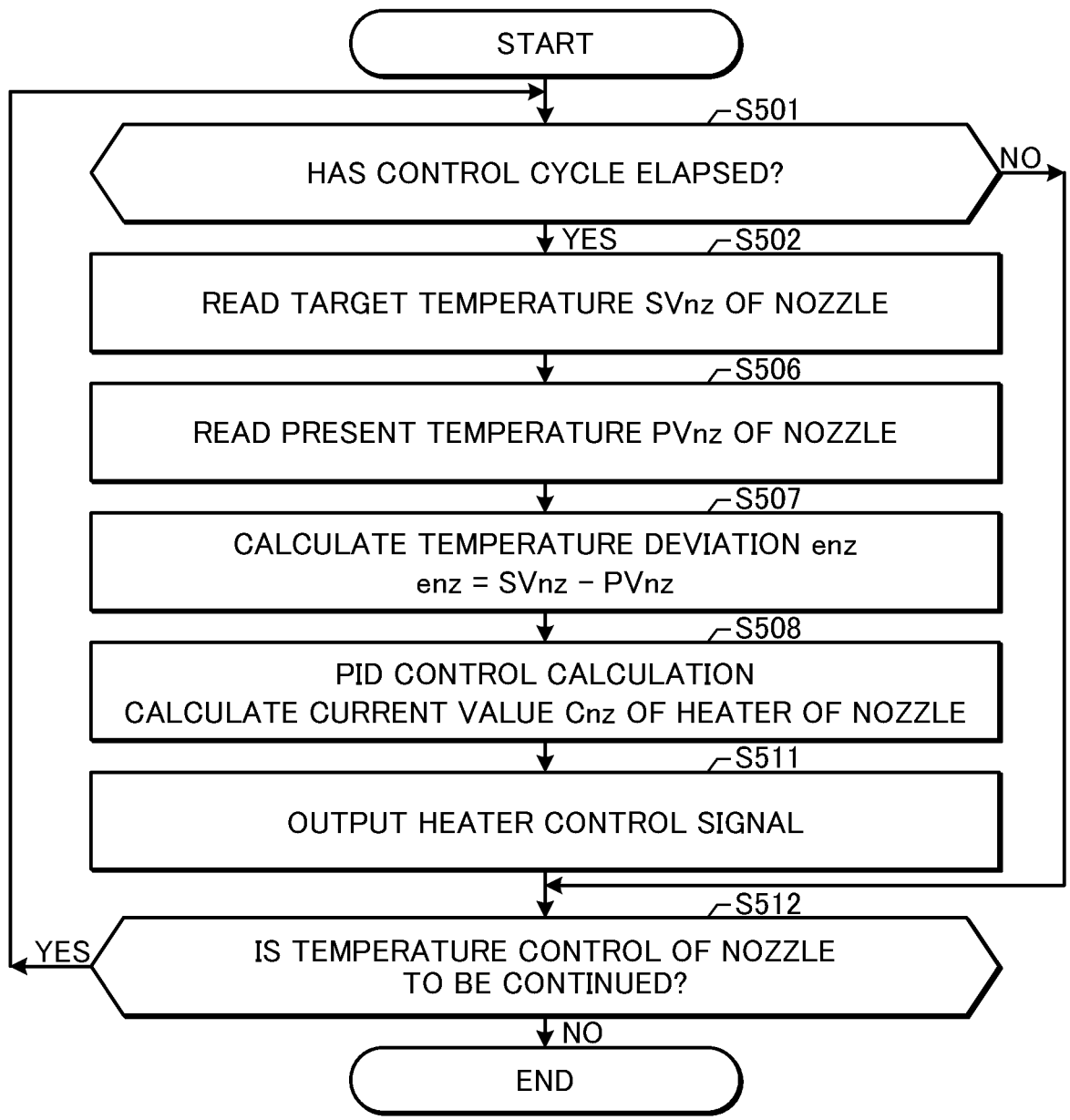
FIG. 9 is a flowchart of the temperature control of a nozzle by the temperature control processor in the comparative example.

FIG. 9 is a flowchart of the temperature control of the nozzle 7nz by the temperature control processor 63 in the comparative example. The temperature control of the nozzle 7nz corresponds to the temperature control of the large tank 71t described with reference to FIG. 7 with the following points replaced.

Step numbers starting from "S3" are replaced with step numbers starting from "S5."

The target temperature SVlt of the large tank 71t is replaced with the target temperature SVnz of the nozzle 7nz. Specific numerical values of the target temperatures SVlt, SVnz may be the same as each other.

The present temperature PVlt of the large tank 71t is replaced with the present temperature PVnz of the nozzle 7nz.

The temperature deviation elt is replaced with the temperature deviation enz.

The current value Clt of the heater 81*t* is replaced with the current value Cnz of the heater 8*nz*.

2.2.6 Block Diagram

Figure 10:
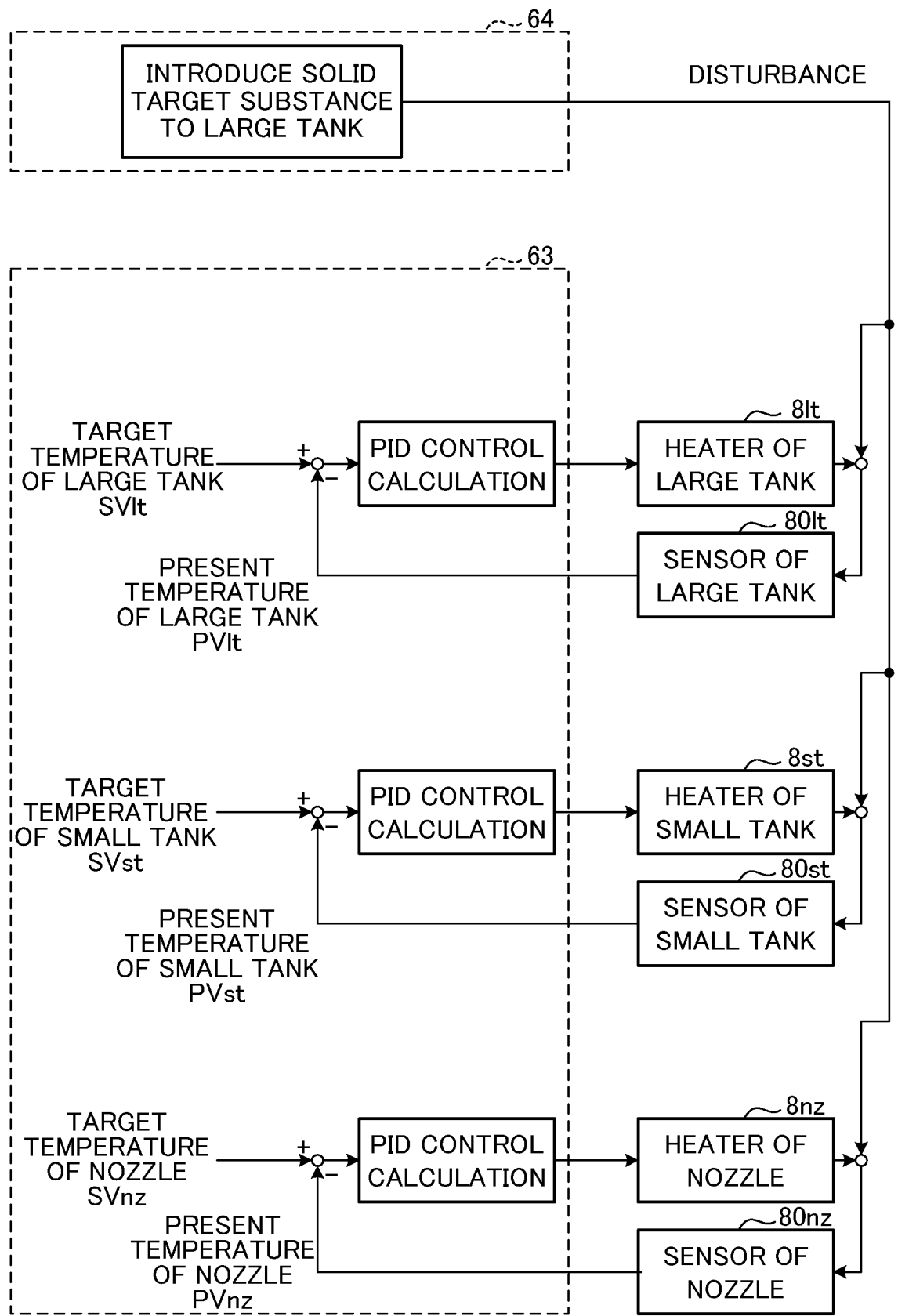
FIG. 10 is a block diagram of the temperature control in the comparative example.

FIG. 10 is a block diagram of the temperature control in the comparative example. The temperature control is performed for each of the large tank 71*t*, the small tank 7*st*, and the nozzle 7*nz* in a mutually independent manner. The temperature deviations elt, est, enz of the large tank 71*t*, the small tank 7*st*, and the nozzle 7*nz* are calculated from the target temperatures SVlt, SVst, SVnz and the present temperatures PVlt, PVst, PVnz, respectively. The current values Clt, Cst, Cnz of the heaters 81*t*, 8*st*, 8*nz* are calculated by the PID control calculation using the temperature deviations elt, est, enz. The heaters 81*t*, 8*st*, 8*nz* convert electric energy corresponding to the current values Clt, Cst, Cnz to thermal energy, respectively. The thermal energy and disturbance when the solid target substance 27*a* is introduced to the large tank 71*t* affect the present temperatures PVlt, PVst, PVnz. The present temperatures PVlt, PVst, PVnz are detected by the sensors 80l*t*, 80*st*, 80*nz* and feedback is performed.

2.3 Problem of Comparative Example

Figure 11:
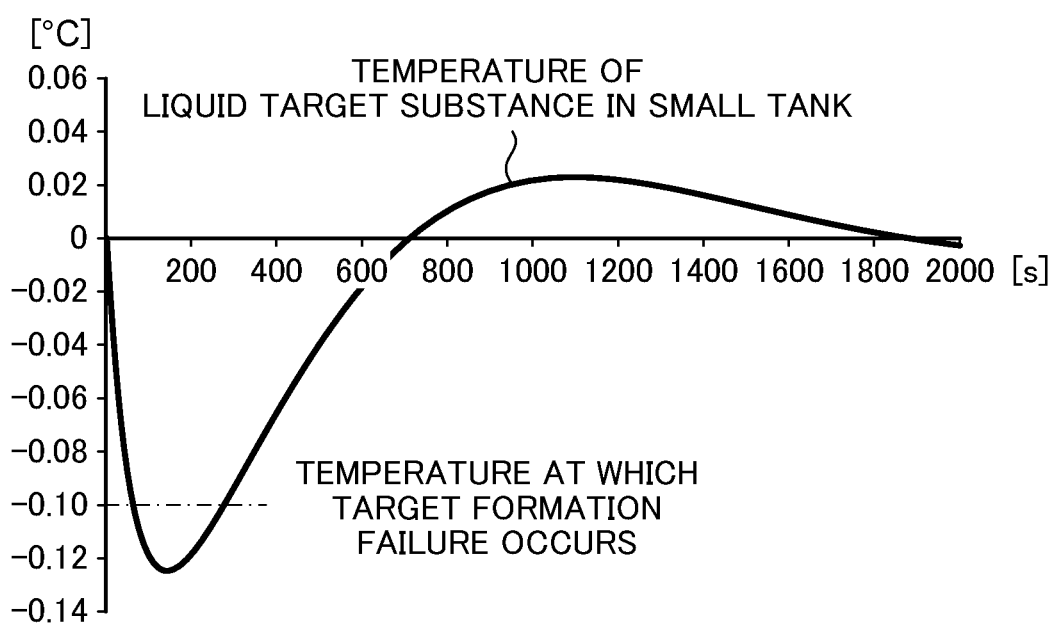
FIG. 11 shows a simulation result of a temperature change of a liquid target substance in the small tank in the comparative example.

FIG. 11 shows a simulation result of a temperature change of the liquid target substance 27*b* in the small tank 7*st* in the comparative example. The horizontal axis represents the elapsed time from the input timing of the solid target substance 27*a*, and the vertical axis represents the temperature deviation with respect to the temperature of the liquid target substance 27*b* at the input timing of the solid target substance 27*a*. The remaining amount of the liquid target substance 27*b* in the target generation unit 260 before introducing the solid target substance 27*a* was 50 cm$^3$, and the input amount of the solid target substance 27*a* was 0.35 cm$^3$.

The liquid target substance 27*b* is deprived of fusion heat by the solid target substance 27*a*, so that the temperature of the liquid target substance 27*b* decreases. Then, the temperature of the liquid target substance 27*b* is recovered by feedback control on the heaters 81*t*, 8*st*, 8*nz*. When the decrease in temperature is within an allowable range, the liquid target substance 27*b* output from the nozzle 7*nz* becomes ideal targets 27 each in the form of a droplet. However, when the decrease in temperature is out of the allowable range, a target formation failure may occur. For example, a decrease of 0.1° C. may cause a target formation failure.

3. Suppression of Temperature Decrease by Feedforward Control

A first embodiment will be described in the following. The configuration of the target supply system 26 according to the first embodiment may be similar to that described with reference to FIG. 2.

3.1 Operation

3.1.1 Input Control of Solid Target Substance 27*a*

Figure 12:
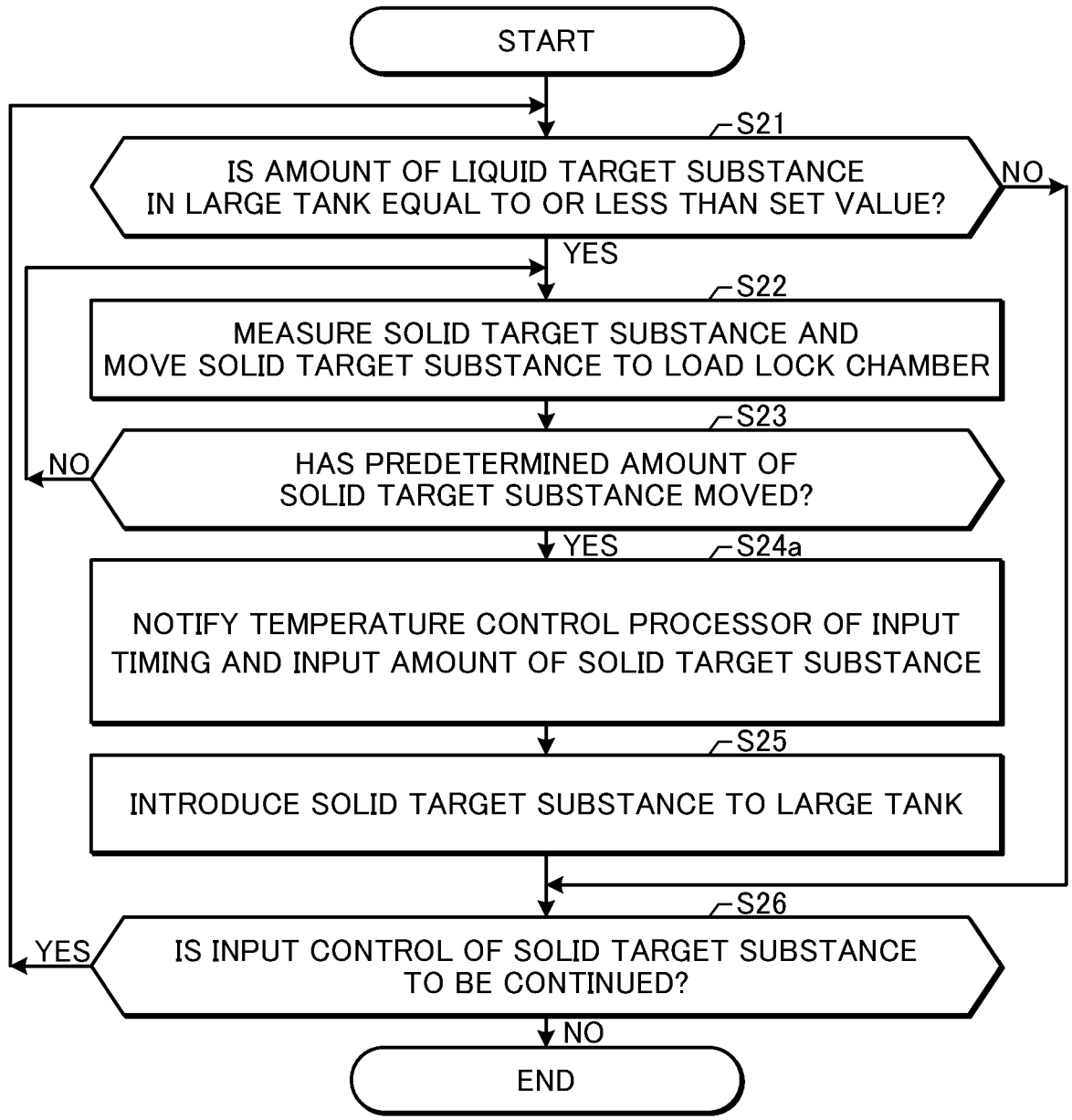
FIG. 12 is a flowchart for an input control processor in a first embodiment.

FIG. 12 is a flowchart for the input control processor 64 in the first embodiment. The process shown in FIG. 12 differs from the process shown in FIG. 6 in the following points.

When the predetermined amount of the solid target substance 27*a* has moved to the load lock chamber C2 (S23: YES), the input control processor 64 advances processing to S24*a*. In S24*a*, the input control processor 64 notifies the temperature control processor 63 of the input timing and the input amount of the solid target substance 27*a*. Then, in S25, the solid target substance 27*a* is introduced to the large tank 71*t*.

3.1.2 Temperature Control of Large Tank 71*t*

The temperature control of the large tank 71*t* may be feedback control similar to that shown in FIG. 7.

3.1.3 Temperature Control of Small Tank 7*st*

Figure 13:
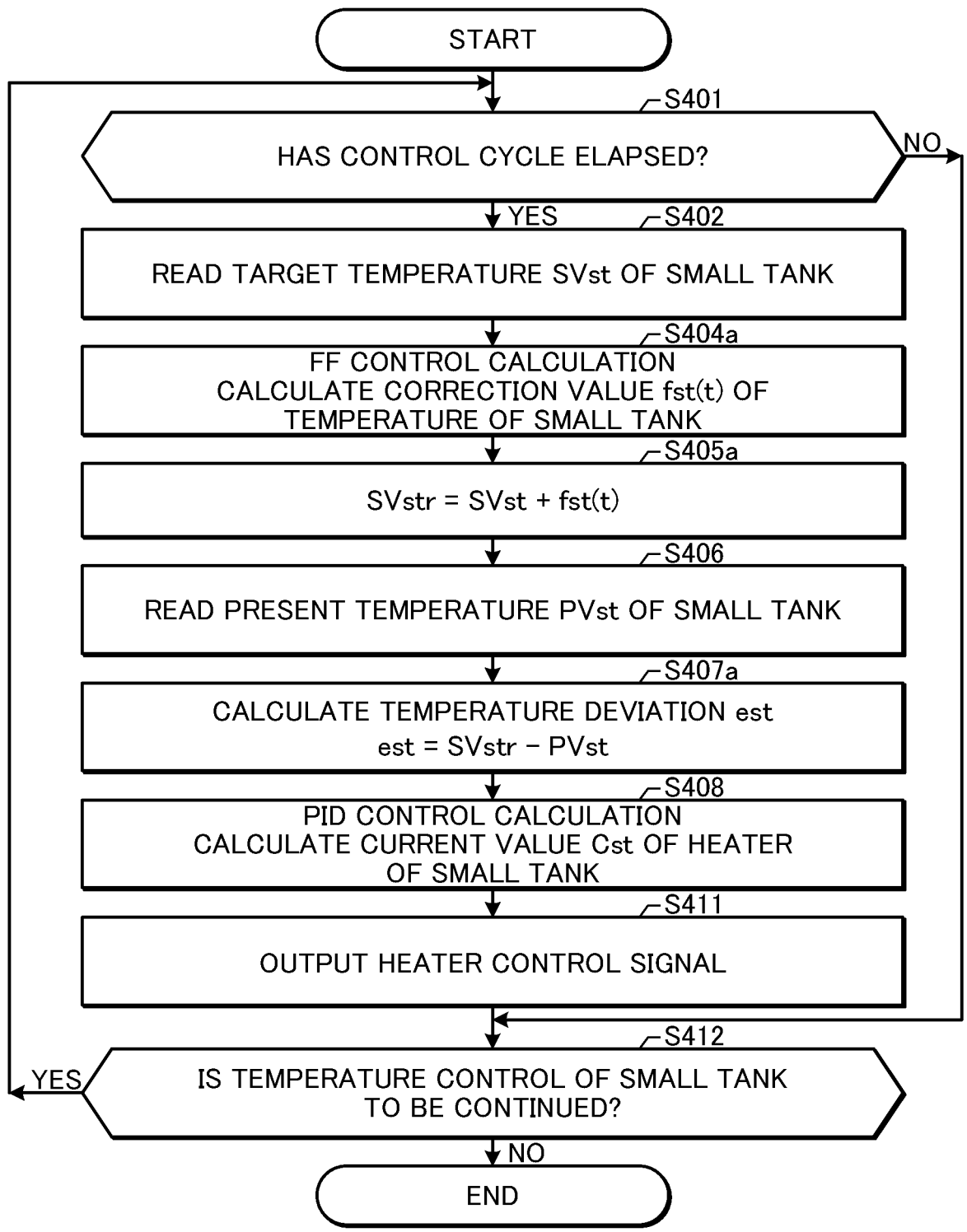
FIG. 13 is a flowchart of the temperature control of the small tank by the temperature control processor in the first embodiment.

FIG. 13 is a flowchart of the temperature control of the small tank 7*st* by the temperature control processor 63 in the first embodiment. The process shown in FIG. 13 differs from the process shown in FIG. 8 in the following points.

After reading the target temperature SVst of the small tank 7*st* in S402, in S404*a*, the temperature control processor 63 calculates a correction value fst(t) of the temperature of the small tank 7*st* by feedforward control calculation. The correction value fst(t) is calculated based on the input timing and the input amount of the solid target substance 27*a* received from the input control processor 64. The correction value fst(t) is a function of time represented by the following equation.

$$fst(t)=N \cdot Ast \cdot \exp(-t/\tau st)$$

Here, N is an input amount of the solid target substance 27*a*, Ast is a control gain, t is an elapsed time from the input timing of the solid target substance 27*a*, and τst is a time constant. The correction value fst(t) is a function that attenuates and approaches 0 in accordance with the elapsed time t.

In S405*a*, the temperature control processor 63 calculates a corrected target temperature SVstr by adding the correction value fst (t) to the target temperature SVst of the small tank 7*st*. The target temperature SVst is an example of the first target value in the present disclosure, and the corrected target temperature SVstr is an example of the second target value in the present disclosure.

Feedback control is performed in S406 to S411. At this time, since the corrected target temperature SVstr is used to calculate the temperature deviation est in S407*a*, feedforward control is performed together with feedback control. Feedforward control is performed in accordance with the control cycle of feedback control.

3.1.4 Temperature Control of Nozzle 7*nz*

The temperature control of the nozzle 7*nz* may be feedback control similar to that shown in FIG. 9.

3.1.5 Block Diagram

Figure 14:
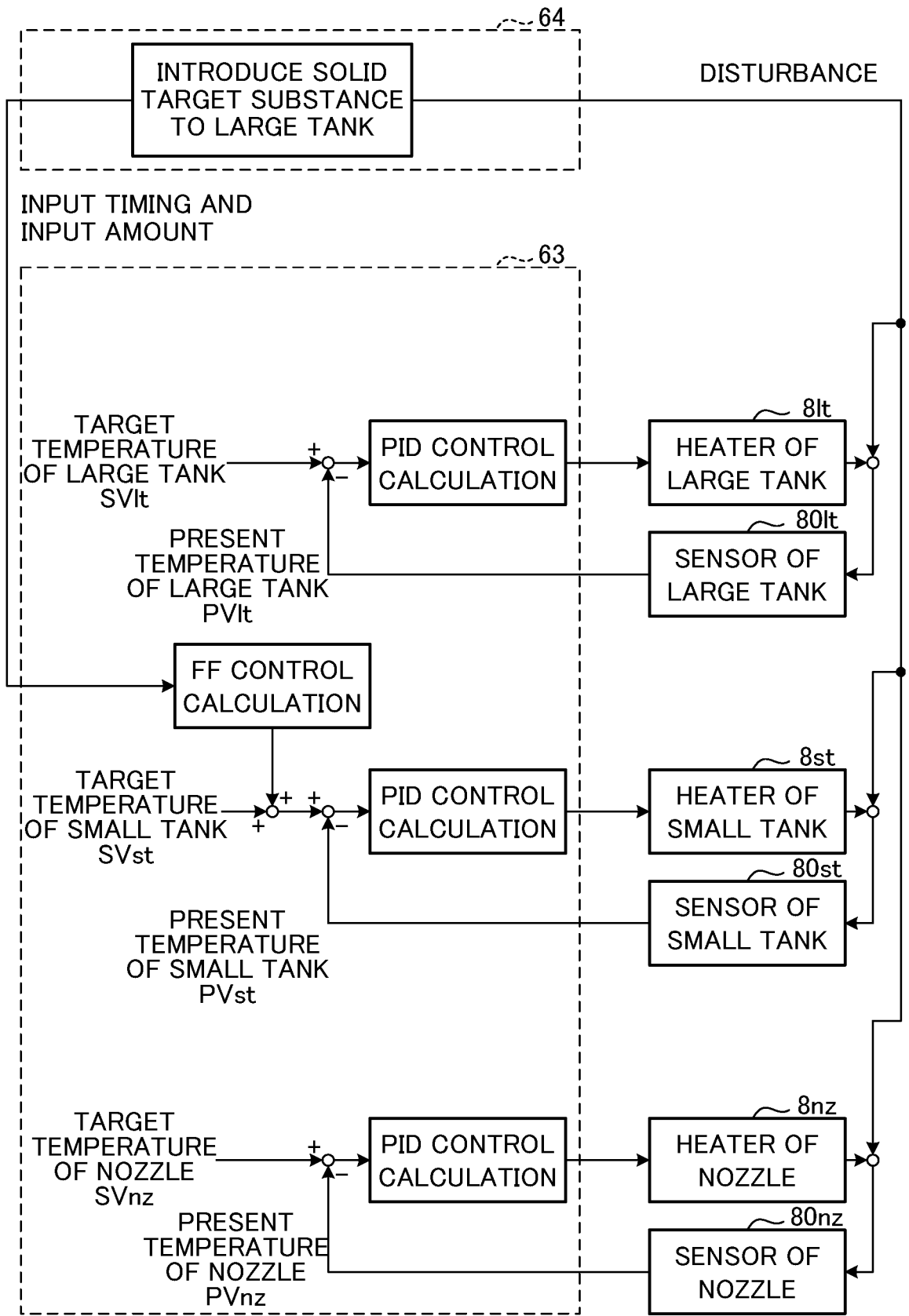
FIG. 14 is a block diagram of the temperature control in the first embodiment.

FIG. 14 is a block diagram of the temperature control in the first embodiment. In the first embodiment, the input control processor 64 transmits the input timing and the input amount of the solid target substance 27*a* to the temperature control processor 63. The temperature control processor 63 calculates the correction value fst (t) by feedforward control calculation based on the input timing and the input amount, and calculates the corrected target temperature SVstr by adding the correction value fst(t) to the target temperature SVst of the small tank 7st. Feedback control and feedforward control are performed by performing feedback control on the heater 8th of the small tank 7th based on the corrected target temperature SVstr.

With respect to the temperature of the large tank 71t and the temperature of the nozzle 7nz, feedforward control based on the input timing and the input amount may not be performed, and feedback control may be performed similarly to the comparative example.

3.2 Simulation Result

Figure 15:
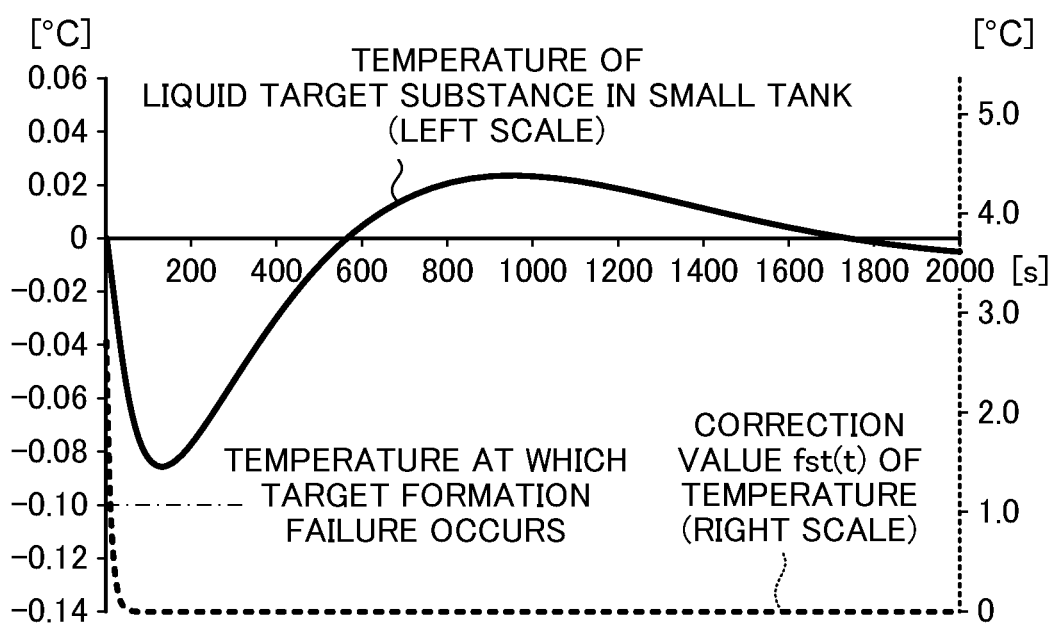
FIG. 15 shows a simulation result of the temperature change of the liquid target substance in the small tank in the first embodiment.

FIG. 15 shows a simulation result of the temperature change of the liquid target substance 27b in the small tank 7st in the first embodiment. The temperature of the liquid target substance 27b decreases after the solid target substance 27a is introduced, and is then recovered by feedback control.

In FIG. 15, the correction value fst(t) of the temperature of the small tank 7st is shown together. The time constant τst of the correction value fst(t) is set to, for example, about 10 seconds, and after the correction value fst(t) becomes substantially 0, the temperature of the liquid target substance 27b becomes the lowest. The next introduction of the solid target substance 27a to the target generation unit 260 is performed thereafter The decrease of the temperature of the liquid target substance 27b is 0.1° C. or more in the comparative example, whereas it is less than 0.1° C. in the first embodiment due to feedforward control. Since the decrease of the temperature is within the allowable range, the occurrence of the target formation failure is suppressed. Thus, the EUV light generation can be stabilized.

3.3 Effect (1) According to the first embodiment, the target supply system 26 includes the target generation unit 260, the input mechanism, the heater 8st, the sensor 80st, the input control processor 64, and the temperature control processor 63. The target generation unit 260 generates the liquid target substance 27b by melting the solid target substance 27a at the inside thereof, and outputs the liquid target substance 27b. The input mechanism includes, for example, the measuring instrument 61, the solid target supply valves VT1, VT2, and the adjustment mechanism 66, and introduces the solid target substance 27a to the target generation unit 260. The heater 8st is arranged at the target generation unit 260. The sensor 80st detects the temperature of the target generation unit 260. The input control processor 64 controls the input timing at which the solid target substance 27a is introduced to the target generation unit 260. The temperature control processor 63 performs feedforward control on the heater 8st based on the input timing while performing feedback control on the heater 8st based on the present temperature PVst detected by the sensor 80st.

According to this, feedforward control is performed, on the heater 8st, based on the input timing of the solid target substance 27a while feedback control is performed, so that the temperature fluctuation when the solid target substance 27a is introduced can be suppressed and the formation of the target 27 can be stabilized.

(2) According to the first embodiment, the temperature control processor 63 performs feedforward control on the heater 8st so that the decrease in the temperature of the target generation unit 260 is less than 0.1° C.

According to this, it is possible to suppress the occurrence of the target formation failure.

(3) According to the first embodiment, the temperature control processor 63 performs feedforward control on the heater 8st in accordance with the control cycle of feedback control on the heater 8st.

According to this, it is possible to suppress an increase in the calculation amount of the control calculation by adjusting the control cycle.

(4) According to the first embodiment, the temperature control processor 63 reads the target temperature SVst of the target generation unit 260, and adds the correction value fst(t) including a feedforward factor to the target temperature SVst to calculate the corrected target temperature SVstr. The temperature control processor 63 further performs feedback control on the heater 8st based on the corrected target temperature SVstr and the present temperature PVst.

According to this, by performing feedback control with the correction value fst(t) added to the target temperature SVst, it is possible to suppress an increase in the calculation amount due to the addition of feedforward control.

(5) According to the first embodiment, the input control processor 64 controls the input amount of the solid target substance 27a introduced to the target generation unit 260, and the temperature control processor 63 calculates the correction value fst(t) based on the input amount.

According to this, the input amount of the solid target substance 27a can be known before the introduction of the solid target substance 27a, and the correction value fst(t) can be calculated in a timely manner. Further, it is possible to avoid a case in which the temperature fluctuation cannot be suppressed due to an excessively large input amount, or a case in which the life of the solid target supply valve VT2 is shortened due to frequent opening and closing of the solid target supply valve SL caused by an excessively small input amount.

(6) According to the first embodiment, the temperature control processor 63 causes the correction value fst(t) to approach 0 while performing feedback control on the heater 8st.

According to this, feedforward control can be performed, on the heater 8st, only for a required period while feedback control is performed.

(7) According to the first embodiment, the input control processor 64 controls the input timing so that the solid target substance 27a is introduced to the target generation unit 260 in a state that the correction value fst(t) is substantially 0.

According to this, since the next feedforward control is started in a state in which the correction value fst(t) is substantially 0, it is possible to avoid complication of the feedforward control calculation.

(8) According to the first embodiment, the target generation unit 260 includes the first region in which the solid target substance 27a is melted at the inside thereof to generate the liquid target substance 27b, and the second region including the nozzle 7nz for outputting the liquid target substance 27b generated in the first region. The target generation unit 260 includes the heater 81t arranged at the first region, and the heater 8st arranged at the second region. The temperature control processor 63 performs feedforward control while performing feedback control on at least one of the heaters 81t, 8st.

According to this, it is possible to select the optimum control for each region in the target generation unit 260.

In the first embodiment, description has been provided on a case in which feedforward control is performed, on the heater 8st of the small tank 7st, while feedback control is performed, and feedback control is performed on the heater 81*t* of the large tank 71*t* and the heater 8*nz* of the nozzle 7*nz*, but the present disclosure is not limited thereto. Feedforward control may be performed while performing feedback control on at least one of the heaters 81*t*, 8*st*, 8*nz*, and feedback control may be performed on the other heaters.

Further, the small tank 7*st* may not be provided, and in this case, for example, feedback control may be performed on the heater 81*t* of the large tank 71*t*, and feedforward control may be performed while feedback control is performed on the heater 8*nz* of the nozzle 7*nz*.

(9) According to the first embodiment, the temperature control processor 63 performs feedback control on the heater 81*t* and performs feedforward control while performing feedback control on the heater 8*st*.

According to this, the formation of the target 27 can be stabilized by stabilizing the temperature of the small tank 7*st* near the nozzle 7*nz*.

(10) According to the first embodiment, the filter F is arranged between the first region and the second region.

According to this, it is possible to stabilize the temperature of the second region when the solid target substance 27*a* is introduced to the first region.

In other respects, the first embodiment is similar to the comparative example.

4. Example in which Feedforward Control is Selectable

A second embodiment will be described in the following. The configuration of the target supply system 26 according to the second embodiment may be similar to that described with reference to FIG. 2.

4.1 Operation

4.1.1 Input Control of Solid Target Substance 27*a*

Figure 16:
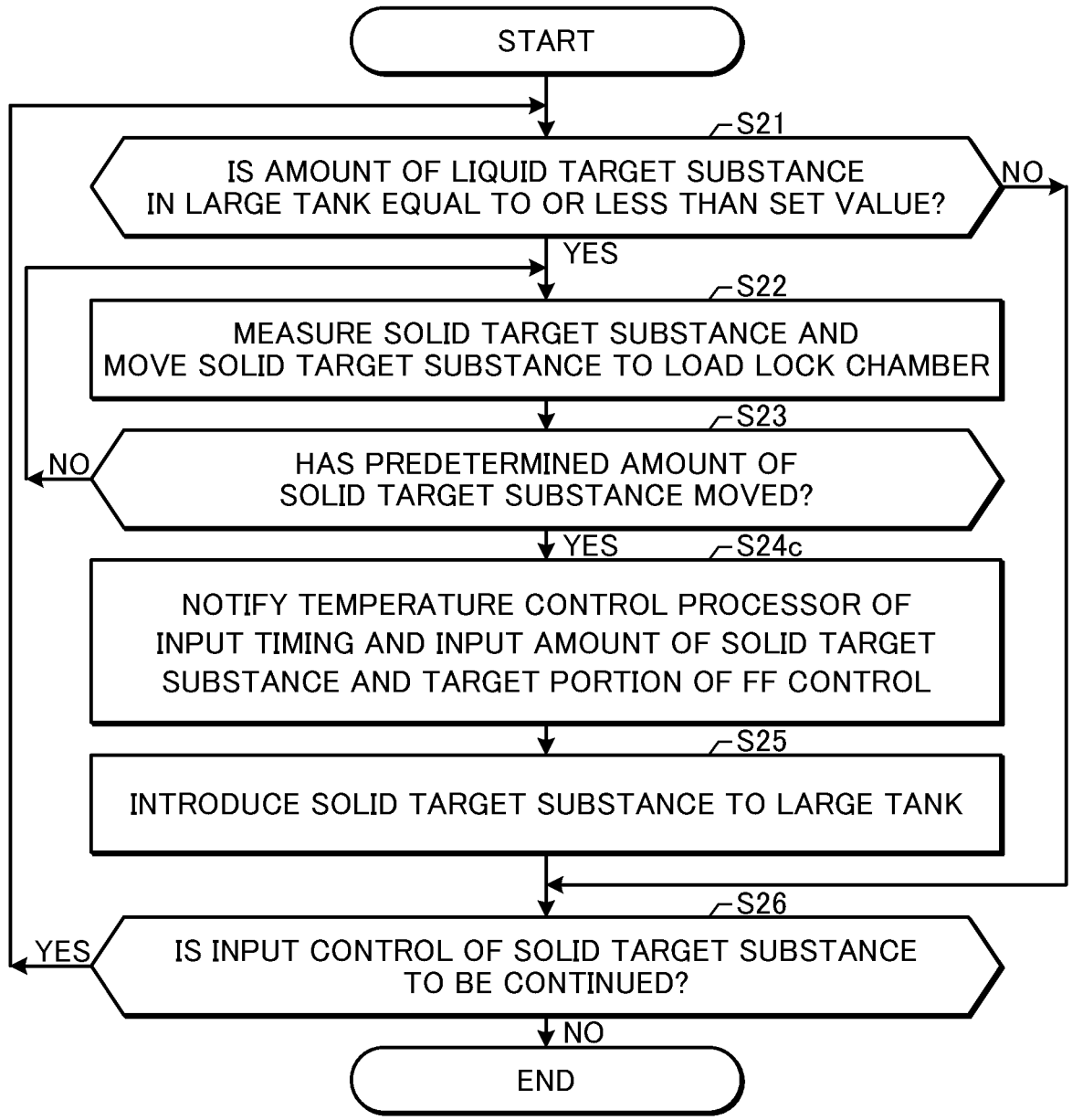
FIG. 16 is a flowchart for the input control processor in a second embodiment.

FIG. 16 is a flowchart for the input control processor 64 in the second embodiment. The process shown in FIG. 16 differs from the process shown in FIG. 12 in the following points.

When the predetermined amount of the solid target substance 27*a* has moved to the load lock chamber C2 (S23: YES), the input control processor 64 advances processing to S24*c*.

In S24*c*, the input control processor 64 notifies the temperature control processor 63 of the input timing and the input amount of the solid target substance 27*a* and also notifies the temperature control processor 63 of the target portion of feedforward control. Then, in S25, the solid target substance 27*a* is introduced to the large tank 71*t*.

The target portion of feedforward control may be determined according to the input amount of the solid target substance 27*a*, or may be selected by a user. In the second embodiment, the heater 8*st* of the small tank 7*st* is subjected to feedforward control, and it is possible to select whether or not to perform feedforward control on each of the heater 81*t* of the large tank 71*t* and the heater 8*nz* of the nozzle 7*nz*.

4.1.2 Temperature Control of Large Tank 71*t*

Figure 17:
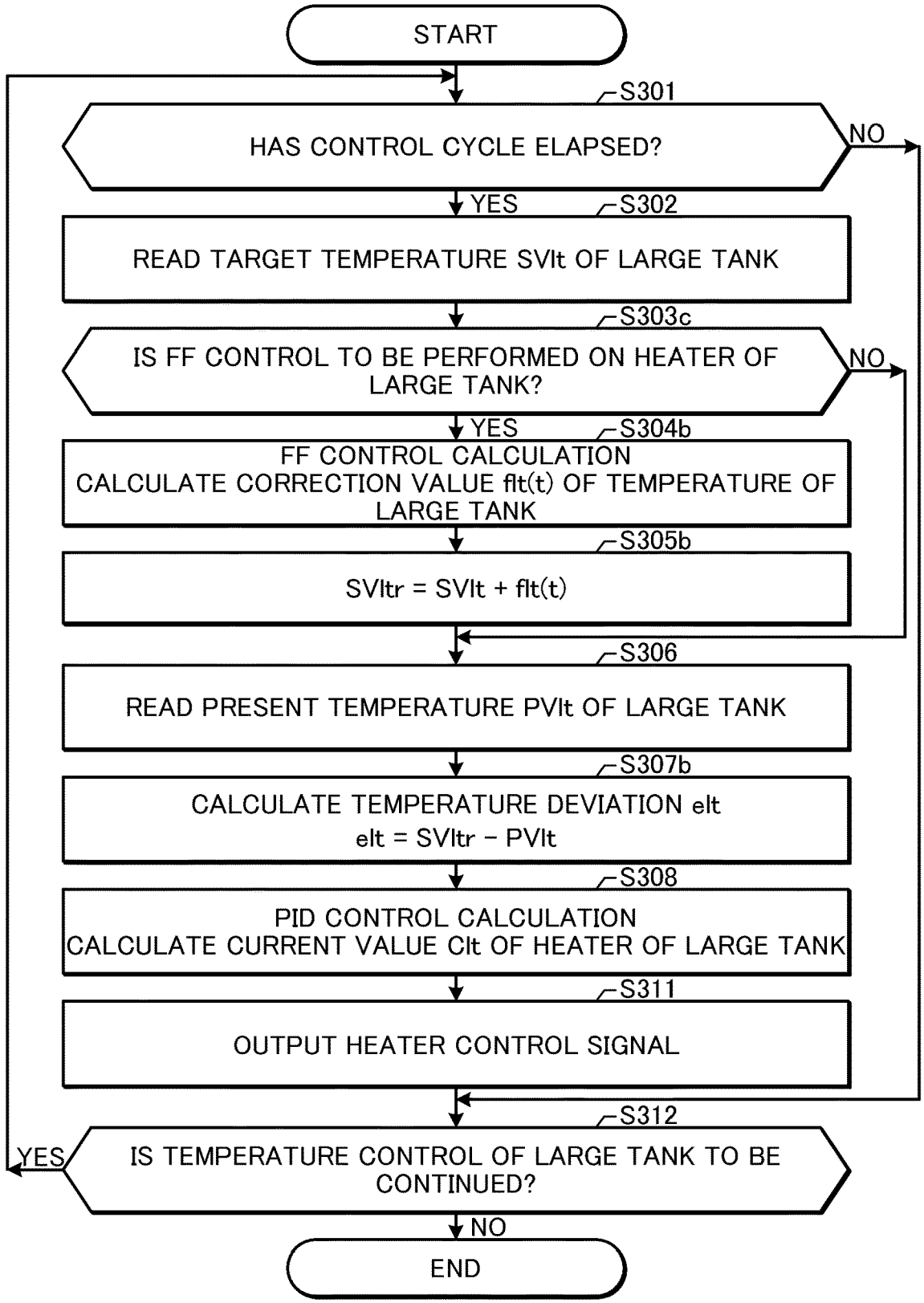
FIG. 17 is a flowchart of the temperature control of the large tank by the temperature control processor in the second embodiment.

FIG. 17 is a flowchart of the temperature control of the large tank 71*t* by the temperature control processor 63 in the second embodiment. The process shown in FIG. 17 differs from the process shown in FIG. 7 in the following points.

After reading the target temperature SVlt of the large tank 71*t* in S302, in S303*c*, the temperature control processor 63 determines whether or not to perform feedforward control on the heater 81*t* of the large tank 71*t*. In the process of FIG. 16, when the large tank 71*t* is set as the target portion of feedforward control, the temperature control processor 63 determines that feedforward control is to be performed (S303*c*: YES), and processing proceeds to S304*b*. When the large tank 71*t* is not set as the target portion of feedforward control, the temperature control processor 63 determines that feedforward control is not to be performed (S303*c*: NO), and processing proceeds to S306.

In S304*b*, the temperature control processor 63 calculates a correction value flt(t) of the temperature of the large tank 71*t* by feedforward control calculation. The correction value flt(t) is calculated based on the input timing and the input amount of the solid target substance 27*a* received from the input control processor 64. The correction value flt(t) is a function of time represented by the following equation.

$$flt(t)=N \cdot Alt \cdot \exp(-t/\tau lt)$$

Here, Alt is a control gain and τlt is a time constant. The correction value flt(t) is a function that attenuates and approaches 0 in accordance with the elapsed time t.

In S305*b*, the temperature control processor 63 calculates a corrected target temperature SVltr by adding the correction value flt(t) to the target temperature SVlt of the large tank 71*t*. The target temperature SVlt is an example of the first target value in the present disclosure, and the corrected target temperature SVltr is an example of the second target value in the present disclosure.

The corrected target temperature SVltr is used to calculate the temperature deviation elt in S307*b*.

4.1.3 Temperature Control of Small Tank 7*st*

The temperature control of the small tank 7*st* may be a combination of feedback control and feedforward control similar to that shown in FIG. 13.

4.1.4 Temperature Control of Nozzle 7*nz*

Figure 18:
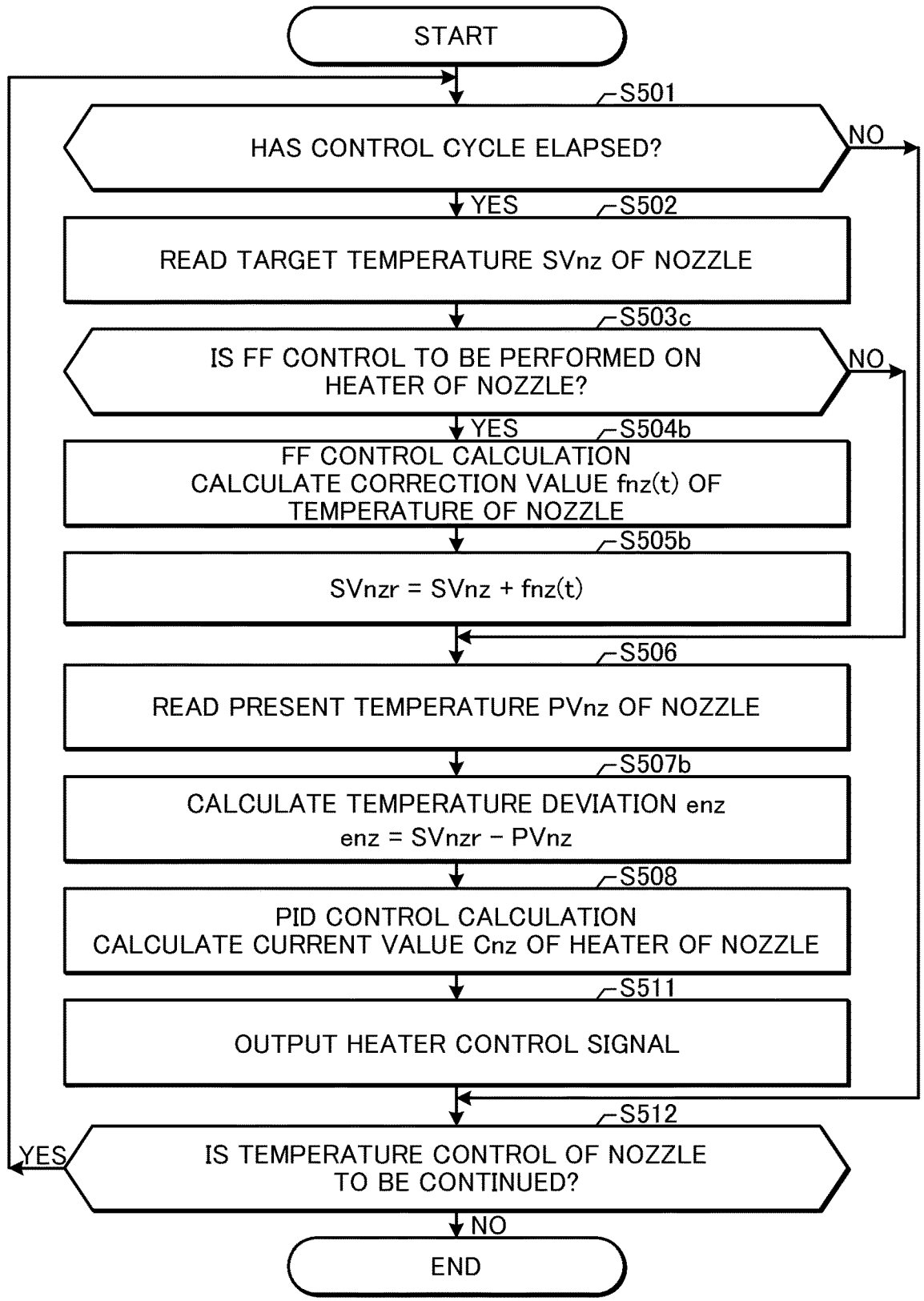
FIG. 18 is a flowchart of the temperature control of the nozzle by the temperature control processor in the second embodiment.

FIG. 18 is a flowchart of the temperature control of the nozzle 7*nz* by the temperature control processor 63 in the second embodiment. The temperature control of the nozzle 7*nz* corresponds to the temperature control of the large tank 71*t* described with reference to FIG. 17 with the following points replaced.

- Step numbers starting from "S3" are replaced with step numbers starting from "S5."
- The target temperature SVlt of the large tank 71*t* is replaced with the target temperature SVnz of the nozzle 7*nz*.
- The correction value flt(t) of the temperature of the large tank 71*t* is replaced with a correction value fnz(t) of the temperature of the nozzle 7*nz*.
- The corrected target temperature SVltr of the large tank 71*t* is replaced with the corrected target temperature SVnzr of the nozzle 7*nz*.
- The present temperature PVlt of the large tank 71*t* is replaced with the present temperature PVnz of the nozzle 7*nz*.
- The temperature deviation elt is replaced with the temperature deviation enz.
- The current value Clt of the heater 81*t* is replaced with the current value Cnz of the heater 8*nz*.

The correction value fnz(t) is a function of time represented by the following equation.

$$fnz(t)=N \cdot Anz \cdot \exp(-t/\tau nz)$$

Here, Anz is a control gain and τlt is a time constant. The correction value fnz(t) is a function that attenuates and approaches 0 in accordance with the elapsed time t.

The set values of the control gains Alt, Ast, Anz for calculating the correction values flt(t), fst(t), fnz(t) may be different from each other. The set values of the time constants τlt, τst, τnz for calculating the correction values flt(t), fst(t), fnz(t) may be different from each other.

4.1.5 Block Diagram

Figure 19:
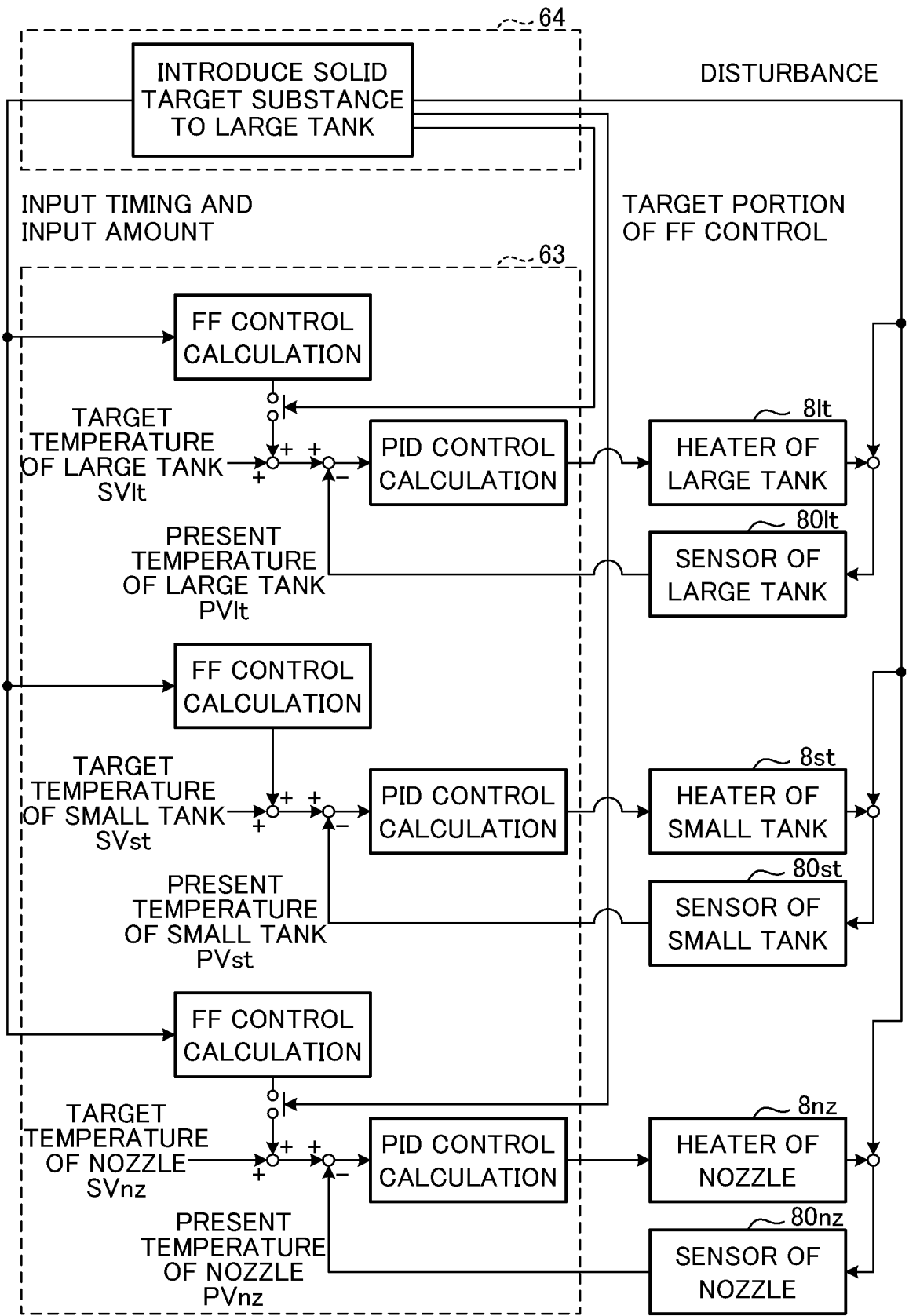
FIG. 19 is a block diagram of the temperature control in the second embodiment.

FIG. 19 is a block diagram of the temperature control in the second embodiment. In the second embodiment, the input control processor 64 notifies the temperature control processor 63 of the target portion of feedforward control.

When the large tank 71*t* is set as the target portion of feedforward control, the temperature control processor 63 performs feedback control on the heater 81*t* of the large tank 71*t* using the corrected target temperature SVltr corrected by the correction value flt(t). When the large tank 71*t* is not set as the target portion of feedforward control, feedback control is performed similarly to the comparative example.

When the nozzle 7*nz* is set as the target portion of feedforward control, the temperature control processor 63 performs feedback control on the heater 8*nz* of the nozzle 7*nz* using the corrected target temperature SVnzr corrected by the correction value fnz(t). When the nozzle 7*nz* is not set as the target portion of feedforward control, feedback control is performed similarly to the comparative example.

The small tank 7*st* is always set as the target portion of feedforward control, and the temperature control processor 63 performs feedback control on the heater 8*st* of the small tank 7*st* using the corrected target temperature SVstr corrected by the correction value fst(t).

4.2 Effect

(11) According to the second embodiment, at least one of the heaters 81*t*, 8*nz* can be selected whether or not feedforward control is performed thereon while feedback control is performed. According to this, it is possible to select the optimum control in accordance with conditions such as the input amount of the solid target substance 27*a*.

In the second embodiment, description has been provided on a case in which the heater 8*st* of the small tank 7*st* is always subjected to feedforward control, but the present disclosure is not limited thereto. It may be possible to select whether or not to perform feedforward control on the heater 8*st* of the small tank 7*st*.

(12) According to the second embodiment, the temperature control processor 63 performs, on the heater 81*t*, feedforward control using a first set value, such as the time constant τlt while performing feedback control. Further, feedforward control is performed, on the heater 8*st*, using a second set value, such as the time constant τst which is different from the first set value, while performing feedback control.

According to this, since the set value of feedforward control can be changed for each region, fine temperature control can be performed.

In other respects, the second embodiment is similar to the first embodiment.

5. Example of Performing Feedforward Control on Temperatures of Small Tank 7*st* and Nozzle 7*nz*

A third embodiment will be described in the following. The configuration of the target supply system 26 according to the third embodiment may be similar to that described with reference to FIG. 2.

5.1 Operation

5.1.1 Input Control of Solid Target Substance 27*a*

The input control of the solid target substance 27*a* may be similar to that in FIG. 12.

5.1.2 Temperature Control of Large Tank 71*t*

The temperature control of the large tank 71*t* may be feedback control similar to that shown in FIG. 7.

5.1.3 Temperature Control of Small Tank 7*st*

The temperature control of the small tank 7*st* may be a combination of feedback control and feedforward control similar to that shown in FIG. 13.

5.1.4 Temperature Control of Nozzle 7*nz*

Figure 20:
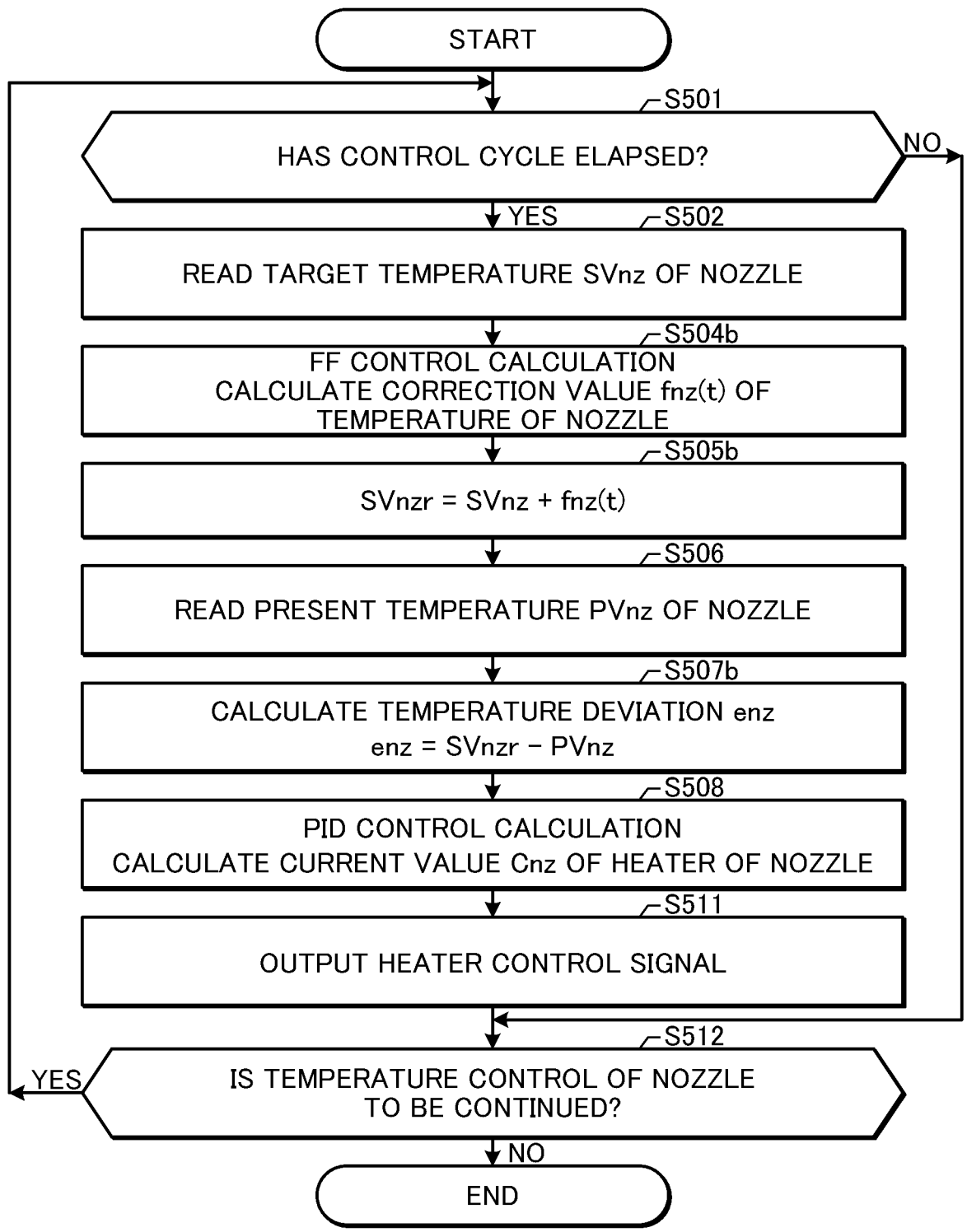
FIG. 20 is a flowchart of the temperature control of the nozzle by the temperature control processor in a third embodiment.

FIG. 20 is a flowchart of the temperature control of the nozzle 7*nz* by the temperature control processor 63 in the third embodiment. The process shown in FIG. 20 differs from the process shown in FIG. 9 in the following points.

After reading the target temperature SVnz of the nozzle 7*nz* in S502, in S504*b*, the temperature control processor 63 calculates the correction value fnz(t) of the temperature of the nozzle 7*nz* by feedforward control calculation. The correction value fnz(t) is calculated based on the input timing and the input amount of the solid target substance 27*a* received from the input control processor 64. The correction value fnz(t) may be similar to that described in the second embodiment.

The set values of the time constant τnz and the control gain Anz for calculating the correction value fnz (t) of the temperature of the nozzle 7*nz* may be larger than the set values of the time constant τst and the control gain Ast for calculating the correction value fst (t) of the temperature of the small tank 7*st*, respectively. The correction value fnz(t) may be a function that attenuates slower than the correction value fst(t).

In S505*b*, the temperature control processor 63 calculates the corrected target temperature SVnzr by adding the correction value fnz(t) to the target temperature SVnz of the nozzle 7*nz*. The target temperature SVnz is an example of the first target value in the present disclosure, and the corrected target temperature SVnzr is an example of the second target value in the present disclosure.

The corrected target temperature SVnzr is used to calculate the temperature deviation enz in S507*b*.

5.1.5 Block Diagram

Figure 21:
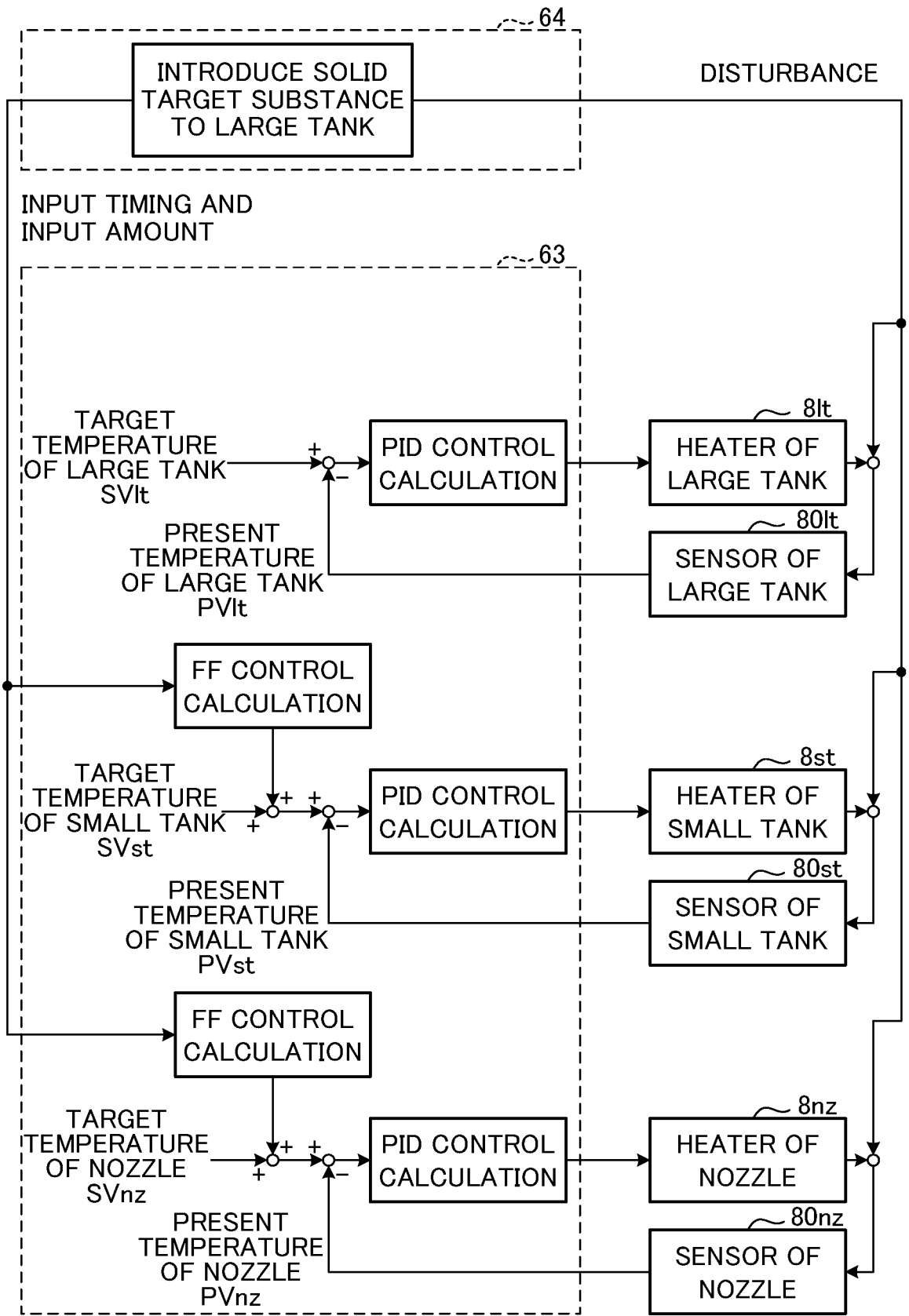
FIG. 21 is a block diagram of the temperature control in the third embodiment.

FIG. 21 is a block diagram of the temperature control in the third embodiment. In the third embodiment, the temperature control processor 63 adds the correction value fnz(t) calculated by the feedforward control calculation based on the input timing and the input amount to the target temperature SVnz of the nozzle 7nz. Feedback control on the heater 8nz of the nozzle 7nz is performed based on the corrected target temperature SVnzr having the correction value fnz(t) added.

With respect to the temperature of the large tank 71t, feedforward control based on the input timing and the input amount may not be performed, and feedback control may be performed similarly to the comparative example.

5.2 Simulation Result

Figure 22:
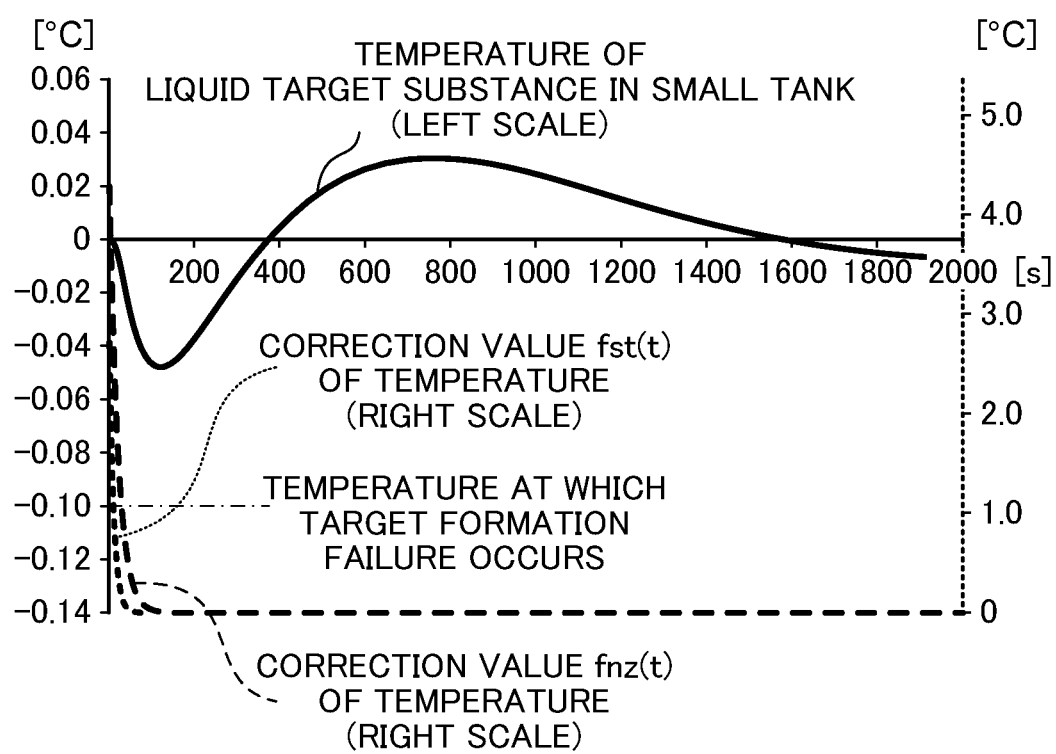
FIG. 22 shows a simulation result of the temperature change of the liquid target substance in the small tank in the third embodiment.

FIG. 22 shows a simulation result of the temperature change of the liquid target substance 27b in the small tank 7st in the third embodiment. The temperature of the liquid target substance 27b decreases after the solid target substance 27a is introduced, and is then recovered by feedback control.

In FIG. 22, the correction value fst(t) of the temperature of the small tank 7st and the correction value fnz(t) of the temperature of the nozzle 7nz are shown together. The time constant τst of the correction value fst(t) is set to, for example, about 10 seconds, and the time constant τnz of the correction value fnz(t) is set to, for example, about 20 seconds. After both of the correction values fst(t), fnz(t) become substantially 0, the temperature of the liquid target substance 27b becomes the lowest. The next introduction of the solid target substance 27a to the target generation unit 260 is performed thereafter.

The decrease of the temperature of the liquid target substance 27b is small compared to the decrease of the temperature in the first embodiment. Since the decrease of the temperature is small, the occurrence of the target formation failure is suppressed. Thus, the EUV light generation can be stabilized.

5.3 Effect

(13) According to the third embodiment, the target generation unit 260 includes the large tank 71t, the nozzle 7nz, and the small tank 7st therebetween. The heater 81t is arranged at the large tank 71t, the heater 8st is arranged at the small tank 7st, and the heater 8nz is arranged at the nozzle 7nz. According to this, by arranging the heater at each of the large tank 71t, the small tank 7st, and the nozzle 7nz, it is possible to perform fine temperature control. In other respects, the third embodiment is similar to the first embodiment.

As described in the first to third embodiments, the small tank 7st may always be set as the target portion of feedforward control.

With respect to the nozzle 7nz, only feedback control may be performed as described in the first embodiment, feedforward control may be selectable as described in the second embodiment, or the nozzle 7nz may always be set as the target portion of feedforward control as described in the third embodiment.

6. Example of Performing Feedforward Control Using Correction Value fcst(t) of Current A fourth embodiment will be described in the following. The configuration of the target supply system 26 according to the fourth embodiment may be similar to that described with reference to FIG. 2.

6.1 Operation

6.1.1 Input Control of Solid Target Substance 27a

The input control of the solid target substance 27a may be similar to that in FIG. 12.

6.1.2 Temperature Control of Large Tank 71t

The temperature control of the large tank 71t may be feedback control similar to that shown in FIG. 7.

6.1.3 Temperature Control of Small Tank 7st

Figure 23:
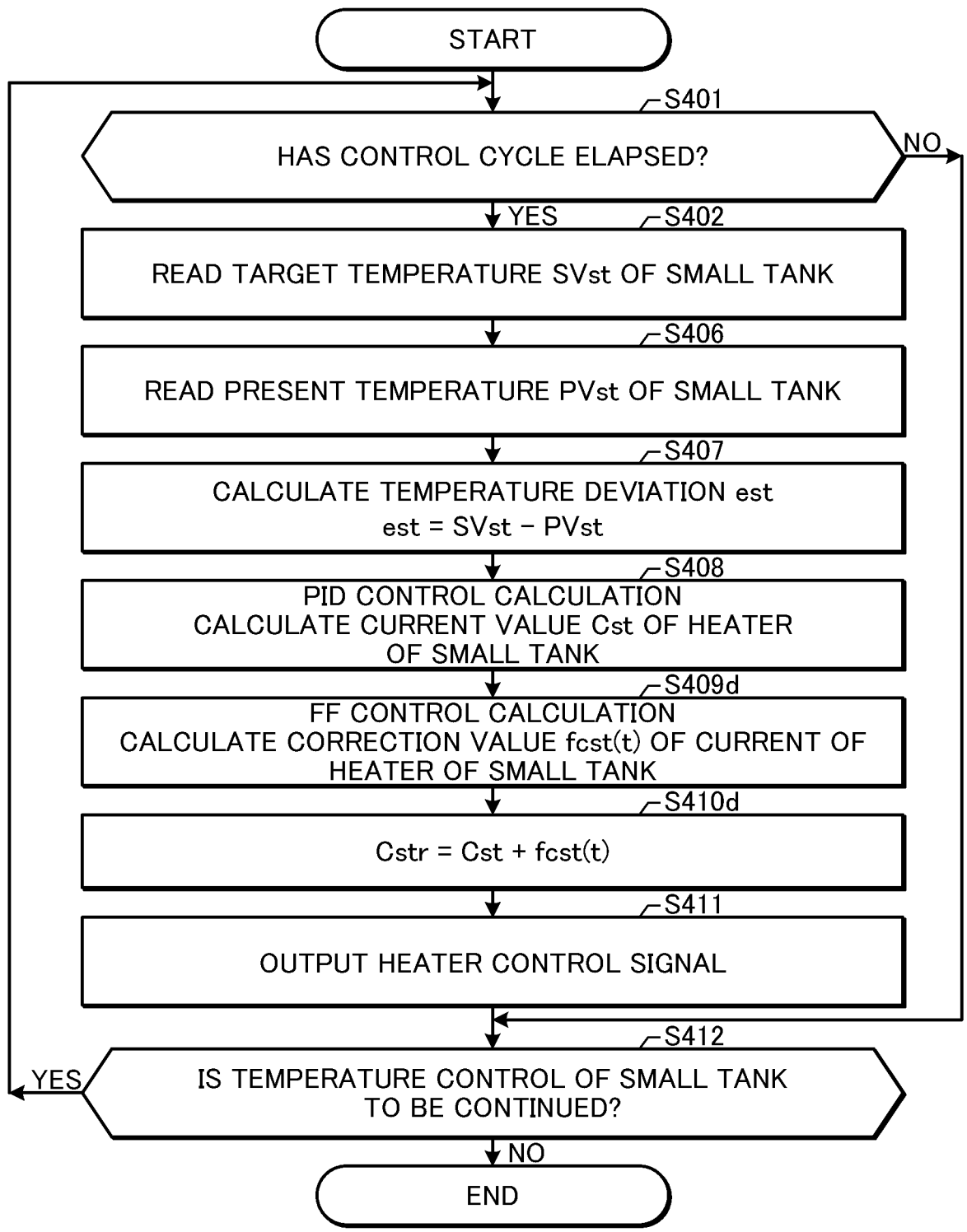
FIG. 23 is a flowchart of the temperature control of the small tank by the temperature control processor in a fourth embodiment.

FIG. 23 is a flowchart of the temperature control of the small tank 7st by the temperature control processor 63 in the fourth embodiment. The process shown in FIG. 23 differs from the process shown in FIG. 8 in the following points.

After calculating the current value Cst of the heater 8st by PID control calculation using the target temperature SVst and the present temperature PVst in S408, the temperature control processor 63 calculates a correction value fcst(t) of the current of the heater 8st by feedforward control calculation in S409d. The correction value fcst(t) is calculated based on the input timing and the input amount of the solid target substance 27a received from the input control processor 64. The correction value fst(t) is a function of time represented by the following equation.

$$fcst(t) = N \cdot Acst \cdot \exp(-t/\tau cst)$$

Here, Acst is a control gain and τlt is a time constant. The correction value fcst(t) is a function that attenuates and approaches 0 in accordance with the elapsed time t.

In S410d, the temperature control processor 63 calculates a corrected current value Cstr by adding the correction value fcst(t) to the current value Cst of the heater 8st. The current value Cst corresponds to the first current value in the present disclosure, and the corrected current value Cstr corresponds to the second current value in the present disclosure. When the heater control signal is output in S411, the corrected current value Cstr is used.

6.1.4 Temperature Control of Nozzle 7nz

The temperature control of the nozzle 7nz may be feedback control similar to that shown in FIG. 9.

6.1.5 Block Diagram

Figure 24:
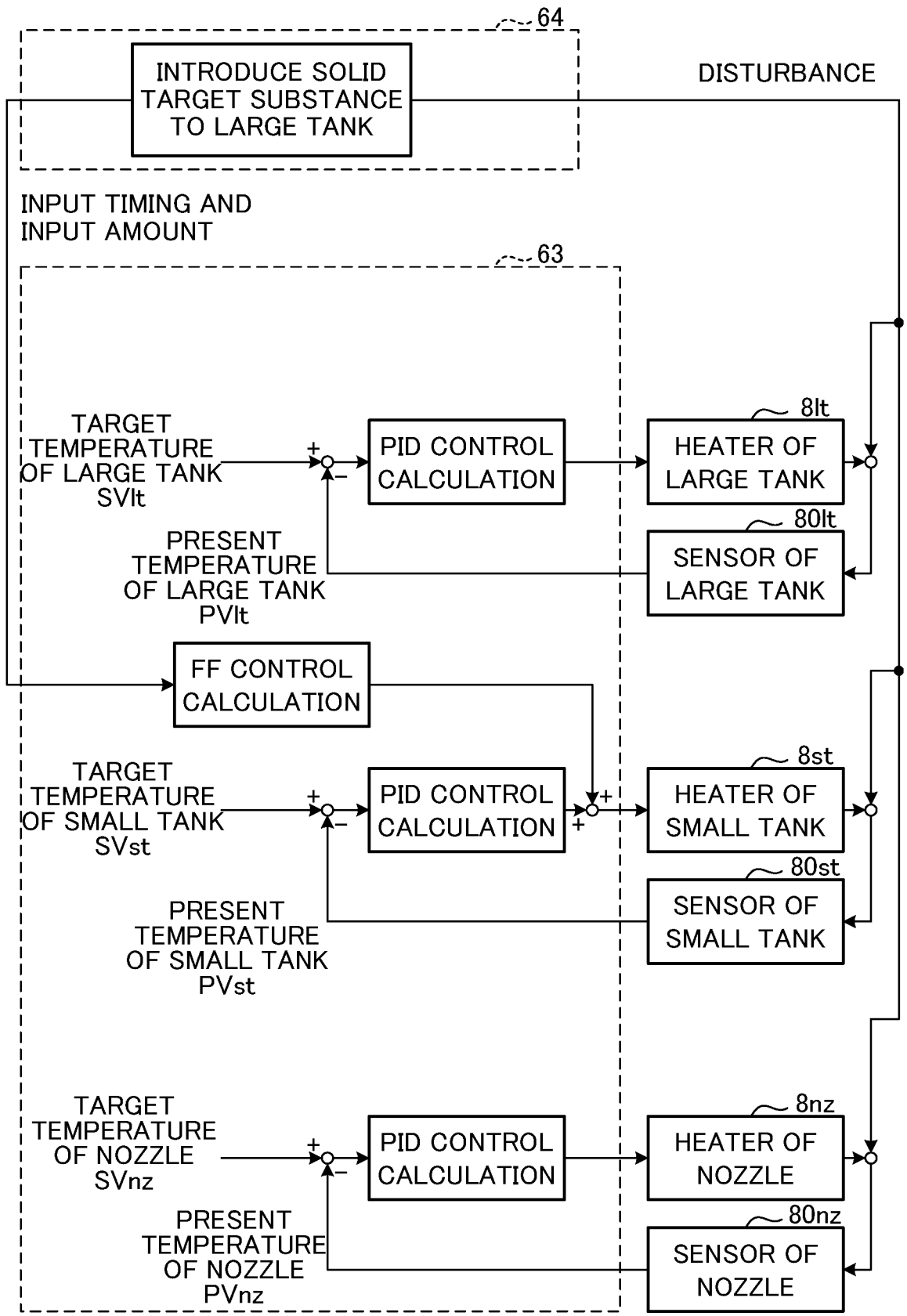
FIG. 24 is a block diagram of the temperature control in the fourth embodiment.

FIG. 24 is a block diagram of the temperature control in the fourth embodiment. In the fourth embodiment, the temperature control processor 63 adds the correction value fcst(t) calculated by feedforward control calculation based on the input timing and the input amount to the current value Cst of the heater 8st calculated by PID control calculation. The control of the heater 8st is performed using the corrected current value Cstr having the correction value fcst(t) added.

With respect to the temperature of the large tank 71t and the temperature of the nozzle 7nz, feedforward control based on the input timing and the input amount may not be performed, and feedback control may be performed similarly to the comparative example.

6.2 Simulation Result

Figure 25:
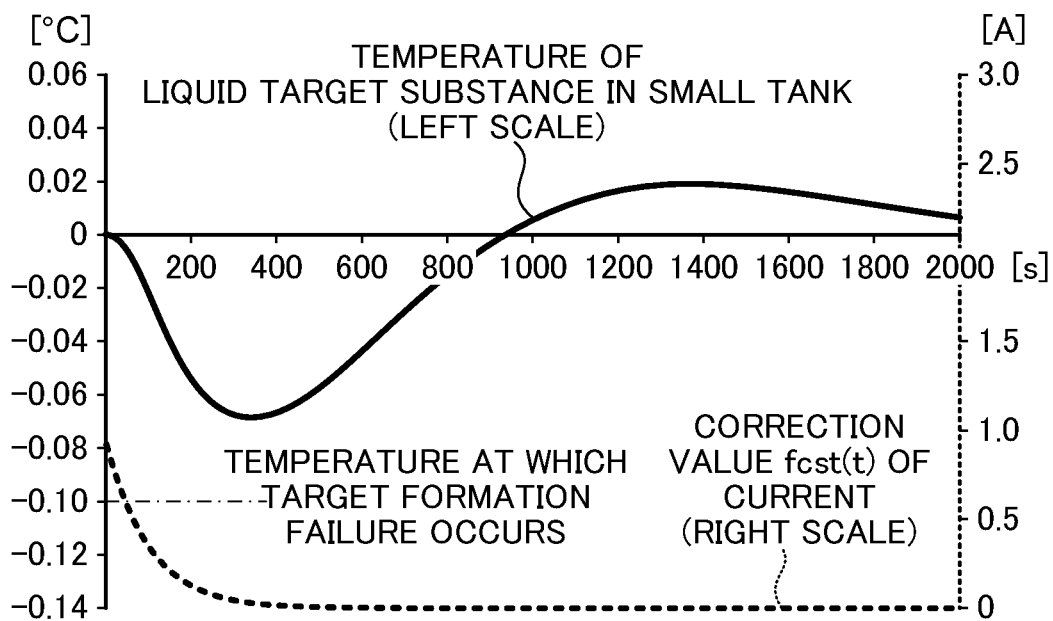
FIG. 25 shows a simulation result of the temperature change of the liquid target substance in the small tank in the fourth embodiment.

FIG. 25 shows a simulation result of the temperature change of the liquid target substance 27b in the small tank 7st in the fourth embodiment. The temperature of the liquid target substance 27b decreases after the solid target substance 27a is introduced, and is then recovered by feedback control.

In FIG. 25, the correction value fcst(t) of the current of the heater 8st is shown together. The time constant τcst of the correction value fcst(t) is set to, for example, about 100 seconds, and the decreased temperature of the liquid target substance 27b recovers after the correction value fcst(t) becomes substantially 0. The next introduction of the solid target substance 27a to the target generation unit 260 is performed thereafter.

The decrease of the temperature of the liquid target substance 27b is 0.1° C. or more in the comparative example, whereas it is less than 0.1° C. in the fourth embodiment. Since the decrease of the temperature is within the allowable range, the occurrence of the target formation failure is suppressed. Further, in the fourth embodiment, it is possible to reduce overshoot after the temperature is once decreased and recovered. Thus, the EUV light generation can be stabilized.

6.3 Effect

(14) According to the fourth embodiment, the temperature control processor 63 reads the target temperature SVst of the target generation unit 260, and calculates the current value Cst of the heater 8st by feedback control calculation based on the target temperature SVst and the present temperature PVst. The temperature control processor 63 calculates the corrected current value Cstr by adding the correction value fcst(t) including a feedforward element to the current value Cst, and controls the heater 8st in accordance with the corrected current value Cstr.

According to this, by performing feedback control with the correction value fst(t) added to the current value Cst, it is possible to suppress an increase in the calculation amount due to the addition of feedforward control.

(15) According to the fourth embodiment, the input control processor 64 controls the input amount of the solid target substance 27a introduced to the target generation unit 260, and the temperature control processor 63 calculates the correction value fcst(t) based on the input amount.

According to this, the input amount of the solid target substance 27a can be known before the introduction of the solid target substance 27a, and the correction value fcst(t) can be calculated in a timely manner. Further, it is possible to avoid a case in which the temperature fluctuation cannot be suppressed due to an excessively large input amount, or a case in which the life of the solid target supply valve VT2 is shortened due to frequent opening and closing of the solid target supply valve SL caused by an excessively small input amount.

(16) According to the fourth embodiment, the temperature control processor 63 causes the correction value fcst(t) to approach 0 while performing control of the heater 8st in accordance with the corrected current value Cstr.

According to this, the feedforward control can be performed, on the heater 8st, only for a required period while feedback control is performed.

(17) According to the fourth embodiment, the input control processor 64 controls the input timing so that the solid target substance 27a is introduced to the target generation unit 260 in a state that the correction value fcst(t) is substantially 0.

According to this, since the next feedforward control is started in a state in which the correction value fcst(t) is substantially 0, it is possible to avoid complication of the feedforward control calculation.

In the fourth embodiment, description has been provided on a case in which feedforward control is performed on the heater 8st the small tank 7st, but the present disclosure is not limited thereto. Feedforward control may be performed on the heater 81t of the large tank 71t or the heater 8nz of the nozzle 7nz using the correction current value. It may be possible to select whether or not to perform feedforward control on each of the heaters 81t, 8st, 8nz.

In other respects, the fourth embodiment is similar to the first embodiment.

7. Example in which Waveform of Correction Value fcst (t) of Current is Rectangular Wave FIG. 26 shows a simulation result of the temperature change of the liquid target substance 27b in the small tank 7st in a fifth embodiment.

Figure 26:
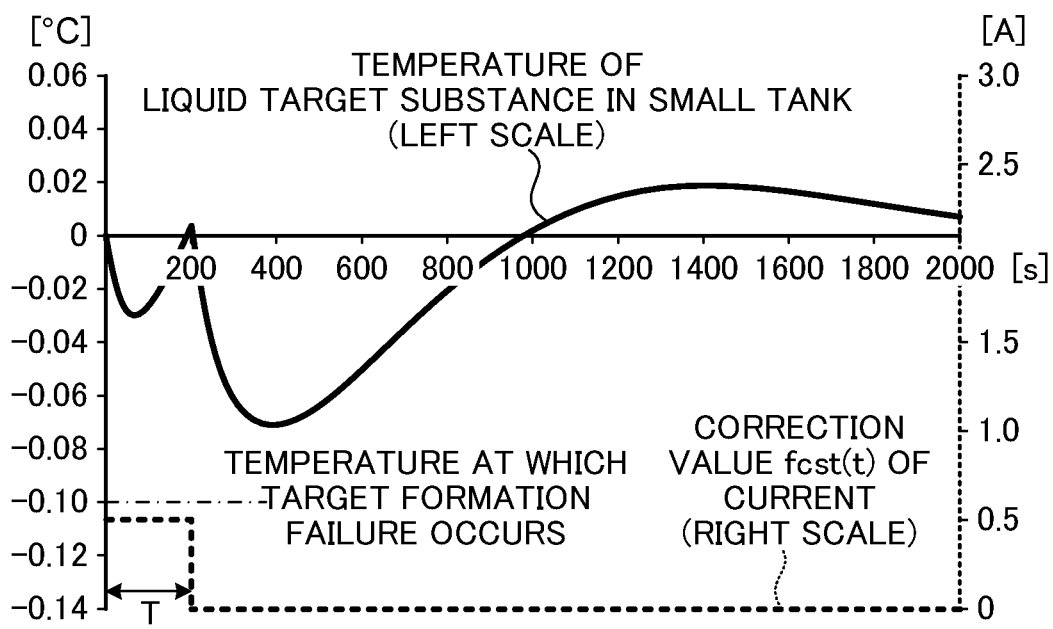
FIG. 26 shows a simulation result of the temperature change of the liquid target substance in the small tank in a fifth embodiment.

In FIG. 26, the correction value fcst(t) of the current of the heater 8st is shown together. In the fifth embodiment, the correction value fcst(t) is not an attenuating function, but is a rectangular wave represented by the following equations.

$$fcst(t)=N \cdot Ac \quad (0 \leq t \leq T)$$

$$fcst(t)=0 \quad (t<0, T<t)$$

Here, Ac is a control gain and T is a time width of the rectangular wave. Due to the rectangular wave, it may be easy to calculate the corrected value fcst(t). The time width T is set to, for example, about 200 seconds, and after the correction value fcst(t) becomes substantially 0, the temperature of the liquid target substance 27b becomes the lowest. The next introduction of the solid target substance 27a to the target generation unit 260 is performed thereafter.

The temperature of the liquid target substance 27b does not significantly decrease during the period in which the correction value fcst(t) is a constant value N·Ac, but may rapidly increase. However, the temperature of the liquid target substance 27b may decrease when the correction value fcst(t) is switched to 0. By changing the control gain Ac and the time width T of the rectangular wave, the temperature change of the liquid target substance 27b can be adjusted.

In other respects, the fifth embodiment is similar to the first embodiment.

8. Others

Figure 27:
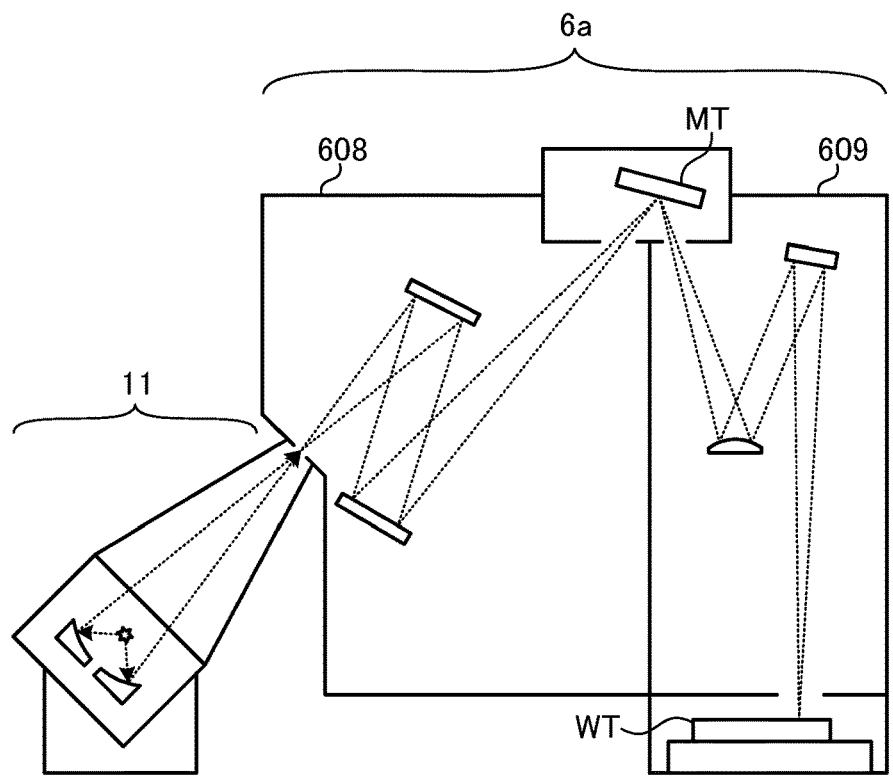
FIG. 27 schematically shows the configuration of an exposure apparatus connected to the EUV light generation system.

FIG. 27 schematically shows the configuration of an exposure apparatus 6a connected to the EUV light generation system 11.

In FIG. 27, the exposure apparatus 6a as the EUV light utilization apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11. The workpiece irradiation unit 609 images the EUV light reflected by the mask table MT onto a workpiece (not shown) arranged on a workpiece table WT via a reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 28:
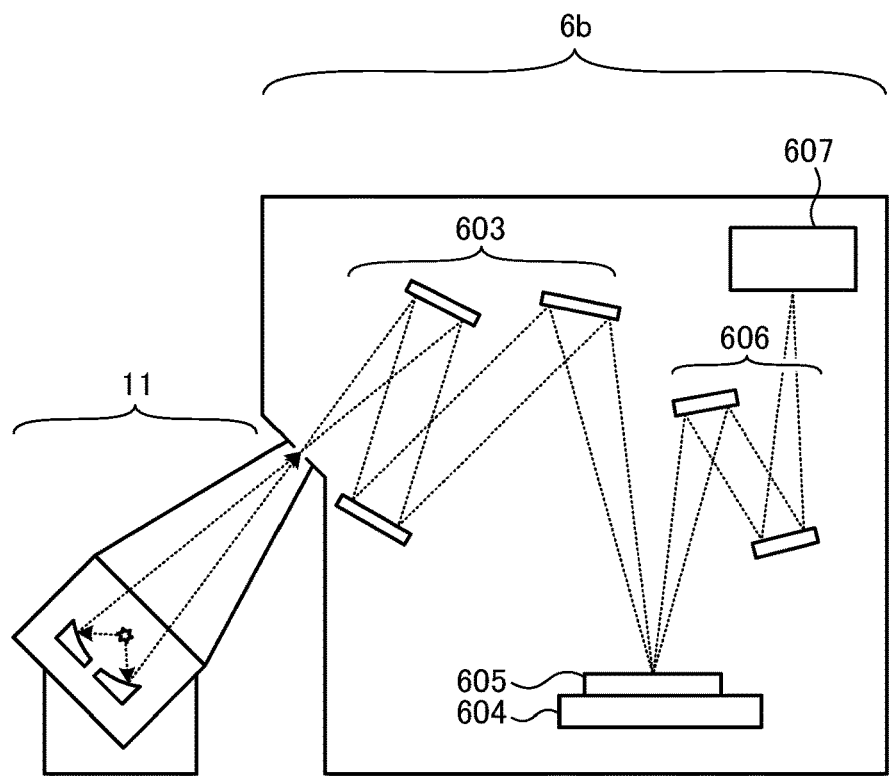
FIG. 28 schematically shows the configuration of an inspection apparatus connected to the EUV light generation system.

FIG. 28 schematically shows the configuration of an inspection apparatus 6b connected to the EUV light generation system 11.

In FIG. 28, the inspection apparatus 6b as the EUV light utilization apparatus 6 (see FIG. 1) includes an illumination optical system 603 and a detection optical system 606. The illumination optical system 603 reflects the EUV light incident from the EUV light generation system 11 to illuminate a mask 605 placed on a mask stage 604. Here, the mask 605 conceptually includes a mask blanks before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) camera.

Defects of the mask 605 are inspected based on the image of the mask 605 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6a.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements.

Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A target supply system comprising:
   a target generation unit configured to generate a liquid target substance by melting a solid target substance at an inside thereof, and output the liquid target substance;
   an input mechanism configured to introduce the solid target substance to the target generation unit;
   a heater arranged at the target generation unit;
   a sensor configured to detect a temperature of the target generation unit; and
   a processor configured to control an input timing at which the solid target substance is introduced to the target generation unit, perform feedback control on the heater based on a present temperature detected by the sensor, and perform feedforward control on the heater based on the input timing while performing feedback control on the heater.

2. The target supply system according to claim 1, wherein the processor performs feedforward control on the heater so that a decrease in the temperature of the target generation unit is less than 0.1° C.

3. The target supply system according to claim 1, wherein the processor performs feedforward control on the heater in accordance with control cycle of feedback control on the heater.

4. The target supply system according to claim 1, wherein the processor reads a first target value of the temperature of the target generation unit, calculates a second target value by adding a correction value including a feedforward factor to the first target value, and performs feedback control on the heater based on the second target value and the present temperature.

5. The target supply system according to claim 4, wherein the processor controls an input amount of the solid target substance to be introduced to the target generation unit, and calculates the correction value based on the input amount.

6. The target supply system according to claim 4, wherein the processor causes the correction value to approach 0 while performing feedback control on the heater.

7. The target supply system according to claim 6, wherein the processor controls an input timing so that the solid target substance is introduced to the target generation unit in a state that the correction value is substantially 0.

8. The target supply system according to claim 1, wherein the target generation unit includes a first region in which the solid target substance is melted at an inside thereof to generate the liquid target substance, and a second region including a nozzle for outputting the liquid target substance generated in the first region,
the heater includes a first heater arranged at the first region and a second heater arranged at the second region, and
the processor performs feedforward control while performing feedback control on at least one of the first and second heaters.

9. The target supply system according to claim 8, wherein the processor performs feedback control on the first heater, and performs feedforward control while performing feedback control on the second heater.

10. The target supply system according to claim 9, wherein a filter is arranged between the first region and the second region.

11. The target supply system according to claim 8, the processor is capable of selecting whether or not to perform feedforward control while performing feedback control on at least one of the first and second heaters.

12. The target supply system according to claim 8, wherein the processor performs feedforward control on the first heater using a first set value while performing feedback control, and performs feedforward control on the second heater, using a second set value different from the first set value while performing feedback control.

13. The target supply system according to claim 8, wherein the first region includes a first tank,
the second region further includes a second tank between the first tank and the nozzle,
the heater further includes a third heater arranged at the second region,
the second heater is arranged at the second tank, and
the third heater is arranged at the nozzle.

14. The target supply system according to claim 1, wherein the processor reads a target temperature of the target generation unit, calculates a first current value of the heater by feedback control calculation based on the target temperature and the present temperature, calculates a second current value by adding a correction value including a feedforward factor to the first current value, and controls the heater in accordance with the second current value.

15. The target supply system according to claim 14, wherein the processor controls an input amount of the solid target substance to be introduced to the target generation unit, and calculates the correction value based on the input amount.

16. The target supply system according to claim 14, wherein the processor causes the correction value to approach 0 while controlling the heater in accordance with the second current value.

17. The target supply system according to claim 16, wherein the processor controls an input timing so that the solid target substance is introduced to the target generation unit in a state that the correction value is substantially 0.

18. An extreme ultraviolet light generation apparatus, comprising:
    the target supply system according to claim 1;
    a laser device configured to irradiate, with pulse laser light, the liquid target substance reaching a predetermined region after being output from the target supply system; and
    an EUV light concentrating mirror configured to concentrate extreme ultraviolet light emitted from plasma generated in the predetermined region.

19. An electronic device manufacturing method, comprising:
    generating extreme ultraviolet light using an extreme ultraviolet light generation apparatus;
    outputting the extreme ultraviolet light to an exposure apparatus; and
    exposing a photosensitive substrate to the extreme ultraviolet light in the exposure apparatus to manufacture an electronic device,
    the extreme ultraviolet light generation apparatus including:
    a target supply system;
    a laser device configured to irradiate, with pulse laser light, a liquid target substance reaching a predetermined region after being output from the target supply system; and
    an EUV light concentrating mirror configured to concentrate the extreme ultraviolet light emitted from plasma generated in the predetermined region, and
    the target supply system including:
    a target generation unit configured to generate the liquid target substance by melting a solid target substance at the inside thereof, and output the liquid target substance;
    an input mechanism configured to introduce the solid target substance to the target generation unit;
    a heater arranged at the target generation unit;
    a sensor configured to detect a temperature of the target generation unit; and
    a processor configured to control an input timing at which the solid target substance is introduced to the target generation unit, perform feedback control on the heater based on a present temperature detected by the sensor, and perform feedforward control on the heater based on the input timing while performing feedback control on the heater.

20. An electronic device manufacturing method, comprising:
    inspecting a defect of a mask by irradiating the mask with extreme ultraviolet light generated by an extreme ultraviolet light generation apparatus;
    selecting a mask using a result of the inspection; and
    exposing and transferring a pattern formed on the selected mask onto a photosensitive substrate,
    the extreme ultraviolet light generation apparatus including:
    a target supply system;
    a laser device configured to irradiate, with pulse laser light, a liquid target substance reaching a predetermined region after being output from the target supply system; and
    an EUV light concentrating mirror configured to concentrate the extreme ultraviolet light emitted from plasma generated in the predetermined region, and
    the target supply system including:
    a target generation unit configured to generate the liquid target substance by melting a solid target substance at the inside thereof, and output the liquid target substance;
    an input mechanism configured to introduce the solid target substance to the target generation unit;
    a heater arranged at the target generation unit;
    a sensor configured to detect a temperature of the target generation unit; and
    a processor configured to control an input timing at which the solid target substance is introduced to the target generation unit, perform feedback control on the heater based on a present temperature detected by the sensor, and perform feedforward control on the heater based on the input timing while performing feedback control on the heater.

* * * * *